(12) United States Patent
Son et al.

(10) Patent No.: US 12,336,411 B2
(45) Date of Patent: *Jun. 17, 2025

(54) DISPLAY DEVICE

(71) Applicant: SAMSUNG DISPLAY CO., LTD., Yongin-si (KR)

(72) Inventors: Jung Hyun Son, Seoul (KR); Yo Han Kim, Seoul (KR); Yong Tack Kim, Yongin-si (KR); Byoung Duk Lee, Seongnam-si (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/047,264

(22) Filed: Oct. 17, 2022

(65) Prior Publication Data

US 2023/0060021 A1 Feb. 23, 2023

Related U.S. Application Data

(63) Continuation of application No. 16/595,307, filed on Oct. 7, 2019, now Pat. No. 11,476,311.

(30) Foreign Application Priority Data

Nov. 13, 2018 (KR) .......................... 10-2018-0138699

(51) Int. Cl.
*H10K 59/38* (2023.01)
*H10H 20/851* (2025.01)
(Continued)

(52) U.S. Cl.
CPC ........... *H10K 59/38* (2023.02); *H10H 20/851* (2025.01); *H10K 50/844* (2023.02); *H10K 50/858* (2023.02); *H10K 59/35* (2023.02)

(58) Field of Classification Search
CPC ........ H10K 59/38; H10K 59/35; H10K 59/00; H10K 50/844; H10K 50/858;
(Continued)

(56) References Cited

U.S. PATENT DOCUMENTS 6,991,987 B1 1/2006 Guo et al.
7,187,006 B2 3/2007 Hayashi
(Continued)

FOREIGN PATENT DOCUMENTS

CN 101323192 A 12/2008
CN 101894919 A 11/2010
(Continued)

OTHER PUBLICATIONS

EPO Extended Search Report dated Mar. 30, 2020, for corresponding European Patent Application No. 19208970.4 (9 pages).
(Continued)

*Primary Examiner* — Bac H Au
(74) *Attorney, Agent, or Firm* — Womble Bond Dickinson (US) LLP

(57) ABSTRACT

A display device includes a first substrate; light-emitting elements disposed on the first substrate; an encapsulation film covering the light-emitting elements; a second substrate facing the first substrate; a first outermost film disposed on the second substrate to face the encapsulation film and including $AO_XN_Y$ (where A is a metal or non-metal element and X>Y); and a filler material disposed between the encapsulation film and the first outermost film and placed in direct contact with the first outermost film.

16 Claims, 35 Drawing Sheets

(51) Int. Cl.
  *H10K 50/844* (2023.01)
  *H10K 50/858* (2023.01)
  *H10K 59/35* (2023.01)
(58) Field of Classification Search
  CPC .......... H10K 50/8426; H10K 50/8445; H10K 50/80; H01L 33/50; H10H 20/851
  See application file for complete search history.

(56) References Cited

U.S. PATENT DOCUMENTS

| | | | |
|---|---|---|---|
| 9,661,693 | B2 | 5/2017 | Hanamura |
| 10,804,334 | B2 | 10/2020 | Song et al. |
| 11,476,311 | B2 * | 10/2022 | Son .................. H10K 50/844 |
| 2010/0096984 | A1 | 4/2010 | Kim |
| 2010/0111130 | A1 | 5/2010 | Murayama et al. |
| 2010/0213828 | A1 | 8/2010 | Seo et al. |
| 2010/0244010 | A1 | 9/2010 | Moriya |
| 2011/0037059 | A1 | 2/2011 | Gyoda |
| 2011/0084290 | A1 | 4/2011 | Nakamura et al. |
| 2012/0038267 | A1 | 2/2012 | Hanamura et al. |
| 2013/0065476 | A1 | 3/2013 | Kim |
| 2014/0042408 | A1 | 2/2014 | Akagawa et al. |
| 2014/0117334 | A1 | 5/2014 | Nakamura et al. |
| 2015/0209826 | A1 | 7/2015 | Bordia et al. |
| 2016/0126494 | A1 | 5/2016 | Jung et al. |
| 2017/0153366 | A1 | 6/2017 | Park et al. |
| 2017/0279084 | A1 | 9/2017 | Sakamoto et al. |
| 2018/0006258 | A1 | 1/2018 | Kim et al. |
| 2018/0012739 | A1 | 1/2018 | Yamazaki et al. |
| 2018/0047800 | A1 | 2/2018 | Choi et al. |
| 2018/0061894 | A1 | 3/2018 | Kim |
| 2018/0076417 | A1 | 3/2018 | Song et al. |
| 2020/0258946 | A1 | 8/2020 | Kim et al. |

FOREIGN PATENT DOCUMENTS

| | | |
|---|---|---|
| CN | 101971701 A | 2/2011 |
| CN | 104183778 A | 12/2014 |
| CN | 105575997 A | 5/2016 |
| CN | 106653800 A | 5/2017 |
| JP | 2009-47879 A | 3/2009 |
| JP | 2016-122606 A | 7/2016 |
| KR | 10-2010-0044624 A | 4/2010 |
| KR | 10-2010-0126399 A | 12/2010 |
| KR | 10-2010-0138191 A | 12/2010 |
| KR | 10-2012-0072949 A | 7/2012 |
| KR | 10-2014-0040598 A | 4/2014 |
| KR | 10-2017-0019306 A | 2/2017 |
| KR | 10-2017-0045757 A | 4/2017 |
| KR | 10-2018-0002933 A | 1/2018 |
| KR | 10-2018-0018969 A | 2/2018 |
| KR | 10-2018-0028850 A | 3/2018 |

OTHER PUBLICATIONS

European Patent Office Action, issued in Patent Application No. 19208970.4, dated Mar. 21, 2022, 10 Pages.
Venu G. Varanasi et al., Abstract of "Role of Hydrogen and Nitrogen on the Surface Chemical Structure of Bioactive Amorphous Silicon Oxynitride Films", The Journal of Physical Chemistry B, 2017, 6 pages, vol. 121, No. 38, American Chemical Society.
Chinese Office Action dated Mar. 22, 2024, for corresponding Application No. 201911104763.X, 9 pages.
Korean Notice of Allowance issued in corresponding Application No. KR 10-2018-0138699, dated Sep. 25, 2024, 2 pages.

* cited by examiner

DISPLAY DEVICE

CROSS-REFERENCE TO RELATED APPLICATIONS

This application is a continuation of U.S. patent application Ser. No. 16/595,307, filed Oct. 7, 2019, which claims priority to and the benefit of Korean Patent Application No. 10-2018-0138699, filed Nov. 13, 2018, the entire content of both of which is incorporated herein by reference.

BACKGROUND

1. Field

The present disclosure relates to a display device and a method of manufacturing the same.

2. Description of the Related Art

Display devices have become increasingly more important with the development of multimedia. Accordingly, various suitable display devices such as a liquid crystal display device (LCD), an organic light-emitting diode (OLED) display device, and/or the like have been developed.

The OLED display device includes OLEDs, which are self-luminous elements. An OLED includes two electrodes facing each other and an organic light-emitting layer interposed between the two electrodes. Electrons and holes from the two electrodes may recombine in the light-emitting layer to generate excitons, and in response to the transition of the excitons from the excited state to the ground state, light may be emitted.

Because the OLED display device does not need a separate light source, the OLED display device has been spotlighted as a next-generation display device due to its numerous enhancements such as low power consumption, thinness (e.g., low thickness), lightweightness (e.g., light-weight), wide viewing angles, high luminance and contrast, and fast response speed.

The OLED display device may include a display substrate on which OLEDs are disposed and a light conversion substrate on which a light conversion member is disposed. The OLED display device may further include a sealing member for bonding the display substrate and the light conversion substrate, and a filler material disposed between the display substrate and the light conversion substrate to fill a space formed by the sealing member, the display substrate, and the light conversion substrate.

When the filler material has weak wetting (e.g., poor wettability) with respect to the light conversion substrate and the display substrate disposed respectively on the top surface and the bottom surface thereof, display defects may happen because the light conversion substrate and/or the display substrate is not properly filled with the filler material.

SUMMARY

An aspect according to one or more embodiments of the present disclosure is directed toward a display device, in which a lyophilic inorganic layer having a high surface tension is placed in contact with a filler material so as to improve the dispersion and wetting characteristics.

Another aspect according to one or more embodiments of the present disclosure is directed toward a method of manufacturing a display device, in which a lyophilic inorganic layer having a high surface tension is placed in contact with a filler material so as to improve the dispersion and wetting characteristics.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a first substrate; a plurality of light-emitting elements on the first substrate; an encapsulation film covering the plurality of light-emitting elements; a second substrate facing the first substrate; a first outermost film on the second substrate, facing the encapsulation film, and including $AO_XN_Y$, wherein A is a metal or non-metal element and X>Y; and a filler material between the encapsulation film and the first outermost film and in direct contact with the first outermost film.

In an exemplary embodiment, a first surface tension of the first outermost film may be greater than a second surface tension of the filler material.

In an exemplary embodiment, the first surface tension of the first outermost film may be about 60 mN/m or greater.

In an exemplary embodiment, a polar component of the first surface tension may be about 35 mN/n or greater.

In an exemplary embodiment, a difference in refractive index between the first outermost film and the filler material may be less than or equal to about 0.2.

In an exemplary embodiment, the first outermost film may have a thickness of about 200 Å to about 1000 Å and a transmittance of about 80% or higher.

In an exemplary embodiment, the metal or non-metal element A may include silicon (Si) or aluminum (Al).

In an exemplary embodiment, the filler material may include one selected from a silicon-based organic material, an epoxy-based organic material, and an acrylic organic material.

In an exemplary embodiment, the display device may further include a sealant between the first and second substrates and surrounding the filler material as viewed in a plan view, wherein the filler material is in a space surrounded by the encapsulation film, the first outermost film, and the sealant.

In an exemplary embodiment, the sealant may be in contact with the filler material and may be in direct contact with surfaces of the first and second substrates to couple the surfaces of the first and second substrates together.

In an exemplary embodiment, each of the plurality of light-emitting elements may include an anode electrode, a cathode electrode facing the anode electrode, and an organic layer between the anode and cathode electrodes and configured to emit blue light.

In an exemplary embodiment, the display device may further include a plurality of light conversion patterns between the second substrate and the first outermost film.

In an exemplary embodiment, the plurality of light-emitting elements may be configured to emit blue light, and the plurality of light conversion patterns may include a first wavelength conversion pattern configured to convert the blue light into red light, a second wavelength conversion pattern configured to convert the blue light into green light, and a light-transmitting pattern configured to transmit the blue light therethrough.

In an exemplary embodiment, the first outermost film may form convex parts in regions where the plurality of light conversion patterns are disposed and concave parts in regions where the plurality of light conversion patterns are not disposed.

In an exemplary embodiment, the filler material may fill the concave parts of the first outermost film.

In an exemplary embodiment, the display device may further include a light shield, wherein the light shield is disposed to overlap with the concave parts of the first outermost film in a thickness direction.

In an exemplary embodiment, the display device may further include a second outermost film on the first substrate, in direct contact with the filler material, and including $BO_PN_Q$, wherein B is a metal or non-metal element and P>Q, wherein the metal or non-metal element B includes silicon or aluminum.

In an exemplary embodiment, a third surface tension of the second outermost film may be greater than a second surface tension of the filler material, the third surface tension may be about 60 mN/m or greater, and a polar component of the third surface tension may be about 35 mN/m or greater.

According to an embodiment of the present disclosure, a display device includes a first substrate; a plurality of light-emitting elements on the first substrate; an encapsulation film covering the light-emitting elements; an outermost film on the encapsulation film and including $AO_XN_Y$, wherein A is a metal or non-metal element and X>Y; a second substrate facing the first substrate; and a filler material between the outermost film and the second substrate and in direct contact with the outermost film.

In an exemplary embodiment, a first surface tension of the outermost film may be greater than a second surface tension of the filler material and the first surface tension may be about 60 mN/m or greater.

In an exemplary embodiment, a polar component of the first surface tension may be about 35 mN/n or greater.

In an exemplary embodiment, a difference in refractive index between the first outermost film and the filler material may be less than or equal to about 0.2.

In an exemplary embodiment, the outermost film may have a thickness of about 200 Å to about 1000 Å and a transmittance of about 80% or higher.

In an exemplary embodiment, the metal or non-metal element A may include silicon or aluminum.

According to the aforementioned and other embodiments of the present disclosure, because a lyophilic inorganic layer having a high surface tension is placed in contact with a filler material, a display device with improved dispersion and wetting characteristics can be provided.

Other features and embodiments may be apparent from the following detailed description, the drawings, and the claims, and equivalents thereof.

BRIEF DESCRIPTION OF THE DRAWINGS

The above and other aspects and features of the present disclosure will become more apparent by describing in more detail embodiments thereof with reference to the attached drawings, in which.

DETAILED DESCRIPTION

Hereinafter, embodiments of the present invention will be described with reference to the attached drawings.

The enhancements and features of the inventive concept and methods for achieving the enhancements and features will be apparent by referring to the embodiments to be described in more detail with reference to the accompanying drawings. However, the inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the inventive concept is only defined within the scope of the appended claims, and equivalents thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Figure 1:
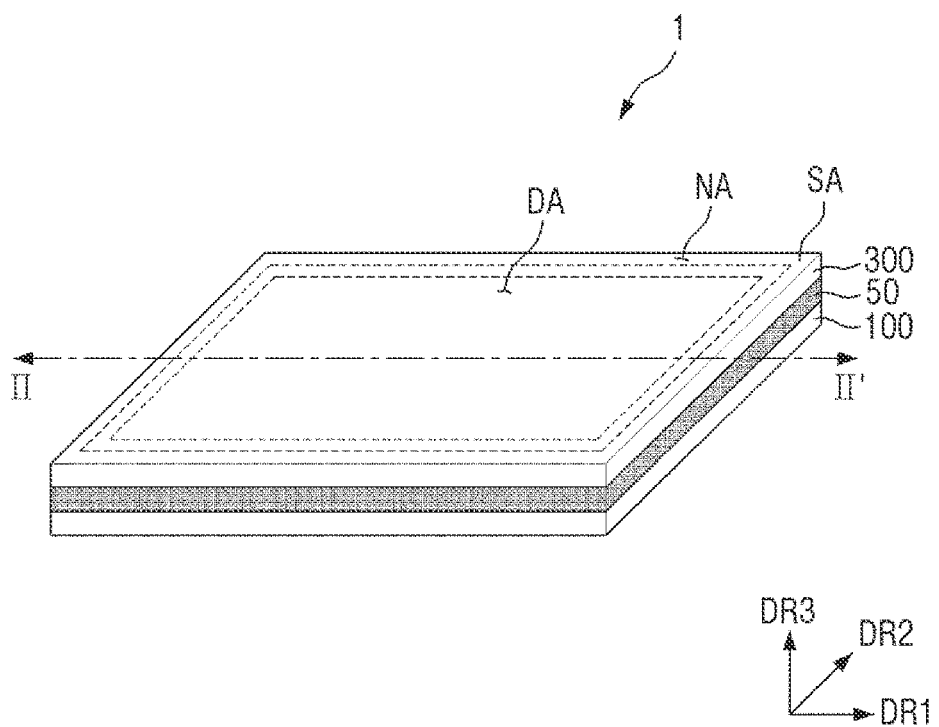
FIG. 1 is a perspective view of a display device according to an embodiment of the present disclosure.
Figure 2:
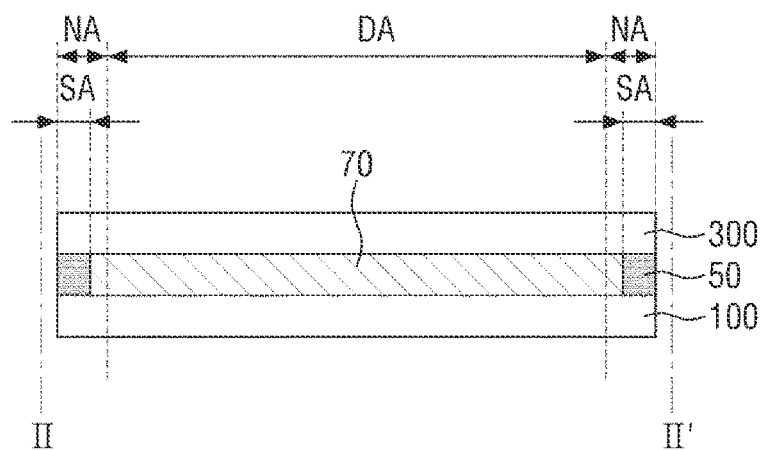
FIG. 2 is a cross-sectional view taken along the line II-II' of FIG. 1.
Figure 3:
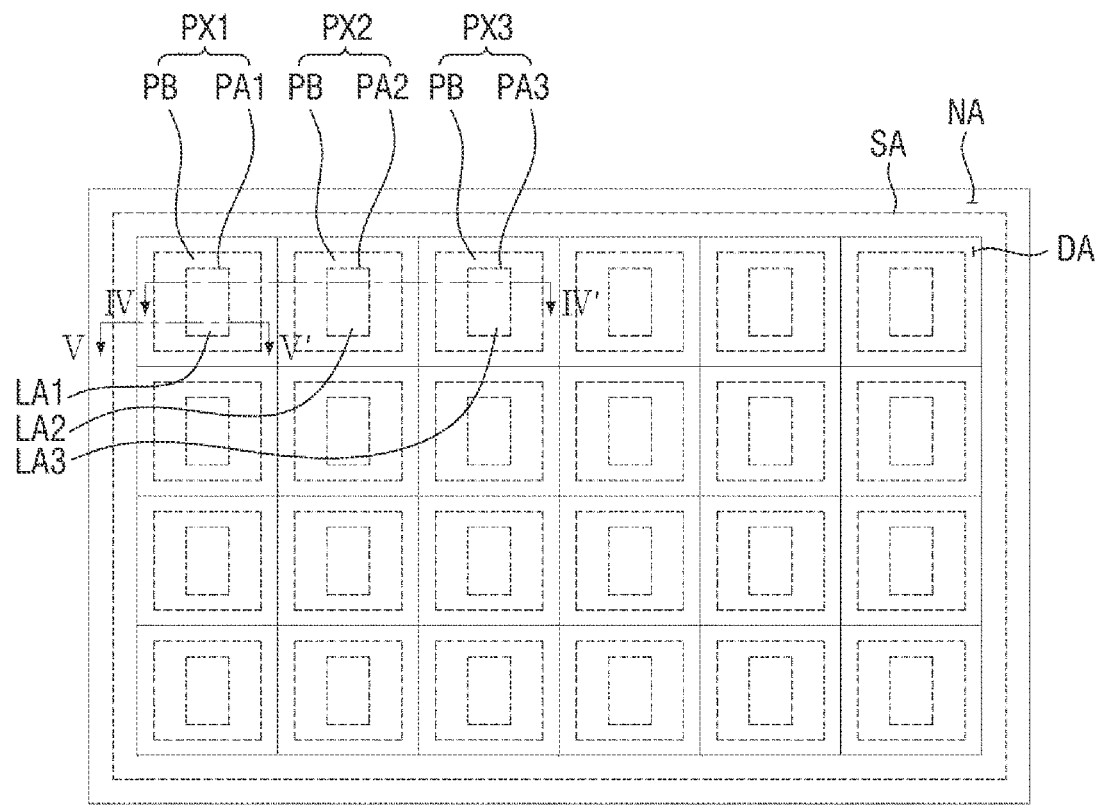
FIG. 3 is a plan view of the display device of FIGS. 1 and 2.
Figure 3:
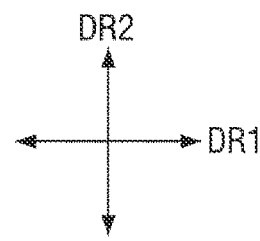

FIG. 1 is a perspective view of a display device according to an embodiment of the present disclosure, FIG. 2 is a cross-sectional view taken along the line II-II' of FIG. 1, and FIG. 3 is a plan view of the display device of FIGS. 1 and 2.

Referring to FIGS. 1 through 3, a display device 1 may be applicable to various suitable electronic devices, such as a tablet personal computer (PC), a smartphone, a car navigation unit, a camera, a central information display (CID) provided in an automobile, a wristwatch-type (e.g., wristwatch-styled) electronic device, a personal digital assistant (PDA), a portable multimedia player (PMP), a small- or medium-sized electronic device such as a gaming device, a television (TV), an external billboard, a monitor, a PC, and/or a notebook computer, but the present disclosure is not limited thereto. That is, the display device 1 may also be applicable to various suitable electronic devices other than those set forth herein.

The display device 1 may have a rectangular shape in a plan view. The display device 1 may include a pair of short sides extending in one (e.g., a first) direction and a pair of long sides extending in another (e.g., a second) direction that crosses or intersects the (e.g., first) direction in which the short sides extend. For example, the long sides of the display device 1 may extend in a first direction DR1, and the short sides of the display device 1 may extend in a second direction DR2 that crosses or intersects the first direction DR1 in a plan view. The corners at which the long sides and the short sides of the display device 1 meet may be right-angled in a plan view, but the present disclosure is not limited thereto. Alternatively, the corners at which the long sides and the short sides of the display device 1 meet may be rounded. The planar shape of the display device 1 is not particularly limited, and the display device 1 may have various suitable shapes other than a rectangular shape, such as a circular, square, or elliptical shape.

The display device 1 may include a display area DA in which an image is displayed and a non-display area NA in which no image is displayed.

The display area DA may be disposed at the center of the display device 1. The display device DA may include a plurality of pixels. The pixels may include a first pixel PX1 emitting light of a first color (e.g., red light having a peak wavelength of about 610 nm to about 650 nm), a second pixel PX2 emitting light of a second color (e.g., green light having a peak wavelength of about 510 nm to about 550 nm), and a third pixel PX3 emitting light of a third color (e.g., blue light having a peak wavelength of about 430 nm to about 470 nm). The first pixel PX1, the second pixel PX2, and the third pixel PX3 may be alternately arranged in row and column directions. The first pixel PX1, the second pixel PX2, and the third pixel PX3 may be arranged in various suitable fashions, such as a stripe fashion or a PenTile fashion.

Each of the first, second, and third pixels PX1, PX2, and PX3 may include a respective first, second, or third light output area PA1, PA2, or PA3, and a non-light output area PB. The first, second, and third light output areas PA1, PA2, and PA3 are defined as areas from which light is output through a display surface, and the non-light output areas PB are defined as areas from which light is not output through the display surface. The non-light output areas PB may be disposed to surround the first, second, and third light output areas PA1, PA2, and PA3. The first, second, and third light output areas PA1, PA2, and PA3 may be distinguished from the non-light output areas PB by a light-shielding member (e.g., a light shield), which will be described in more detail later.

Each of the first, second, and third pixels PX1, PX2, and PX3 may include a respective first, second, or third light emitting area LA1, LA2, or LA3. The first, second, or third light emitting area LA1, LA2, or LA3 may overlap with the respective first, second, or third light output area PA1, PA2, or PA3 in a thickness direction. The first, second, or third light emitting area LA1, LA2, or LA3 may correspond to the respective first, second, or third light output area PA1, PA2, or PA3 in the thickness direction. In a plan view, the first, second, or third light emitting area LA1, LA2, or LA3 may be smaller in size than the respective first, second, or third light output area PA1, PA2, or PA3, but the present disclosure is not limited thereto. Alternatively, the first, second, or third light emitting area LA1, LA2, or LA3 may have substantially the same size as the respective first, second, or third light output area PA1, PA2, or PA3.

The first, second, and third light emitting areas LA1, LA2, and LA3 may be defined as areas that emit light via an organic layer. Non-light emitting areas may be disposed near the first, second, and third light emitting areas LA1, LA2, and LA3. The first, second, and third light emitting areas LA1, LA2, and LA3 may be distinguished from the non-light emitting areas by a bank layer, which will be described in more detail later.

The wavelength of light emitted from each of the first, second, and third pixels PX1, PX2, and PX3 may be controlled not only by light emitted from the first, second, or third light emitting area LA1, LA2, or LA3, but also by a wavelength conversion layer or a color filter disposed to overlap with the light emitting area LA1, LA2, or LA3. For example, the first, second, and third light emitting areas LA1, LA2, and LA3 of the first, second, and third pixels PX1, PX2, and PX3 may all emit light of the same wavelength (e.g., blue light), and the color of the emitted light may be converted into the output colors of the first, second, and third pixels PX1, PX2, and PX3 by the wavelength conversion layers and/or color filters disposed in the first, second, and third pixels PX1, PX2, and PX3.

The non-display area NA may be disposed on the outside of the display area DA and may surround the display area DA. The non-display area NA may include dummy light emitting areas that have substantially the same structure as the light emitting areas of the pixels but are controlled to not emit light. Alternatively, the non-display area NA may include the light emitting areas of the pixels, but the emission of light from the non-display area NA may be blocked by the light-shielding member (e.g., light shield).

The non-display area NA may further include a sealing area SA. The sealing area SA may be an area in which a sealing member (e.g., a sealant) 50, which will be described in more detail later, is disposed. The sealing area SA may be continuously disposed along edge portions of the display device 1 including both long sides and both short sides of the display device 1.

FIGS. 1 and 2 illustrate that the sealing area SA is disposed along all the edges (e.g., four edges) of the display device 1 and is aligned with the sides of the display device 1, but the present disclosure is not limited thereto. That is, alternatively, the sealing area SA may be disposed on the inside of one of the sides of the display device 1. Thus, the sealing area SA can provide a space in which an external device and/or signal pads that are connected to the external device are disposed, and can prevent or substantially prevent the sealing member 50 from flowing out of the display device 1 when yet to be cured.

Referring to FIG. 2, the display device 1 may include a light provider 100, a light converter 300 facing the light provider 100, a filler material 70 interposed between the light provider 100 and the light converter 300, and the sealing member (e.g., sealant) 50 bonding the light provider 100 and the light converter 300 together along the edges of each of the light provider 100 and the light converter 300.

The light provider 100 may include elements and circuits for displaying an image, i.e., pixel circuits such as switching elements, a bank layer defining the first, second, and third light output areas PA1, PA2, and PA3 and the non-light output areas PB in the display area DA, and organic light-emitting diodes (OLEDs). The light provider 100 may be a display substrate.

The light converter 300 is disposed above the light provider 100 and faces the light provider 100. The light converter 300 may be a counterpart substrate facing the display substrate. The light converter 300 may be a color conversion substrate including color conversion patterns that change the color of light (or incident light) provided by the light provider 100, but the present disclosure is not limited thereto.

In the non-display area NA, the sealing member 50 may be disposed between the light provider 100 and the light converter 300. The sealing member 50 may be disposed along the edges of each of the light provider 100 and the light converter 300, and may surround the display area DA in a plan view. Also, the sealing member 50 may be disposed between the light provider 100 and the light converter 300 in the thickness direction. The sealing member 50 may couple the light provider 100 and the light converter 300 together. That is, the light provider 100 and the light converter 300 may be coupled to each other by the sealing member 50. In a plan view, the sealing member 50 may be in the shape of a continuous rectangular frame disposed along the sealing area SA.

The sealing member 50 may include an organic material such as an epoxy resin, but the present disclosure is not limited thereto. The cross-sectional structure of the sealing member 50 and how the sealing member 50 is in contact with the filler material 70 will be described in more detail later.

The filler material 70 may be disposed in a space surrounded by the light provider 100, the light converter 300, and the sealing member 50. The filler material 70 may be formed of a material capable of transmitting light therethrough and may have a buffer function. In one embodiment, the filler material 70 may be formed of an organic material. For example, the filler material 70 may be formed of a silicon-based organic material, an epoxy-based organic material, and/or an acrylic organic material, but the present disclosure is not limited thereto.

The structure of the display device 1 will hereinafter be described with reference to FIGS. 4 through 7.

Figure 4:
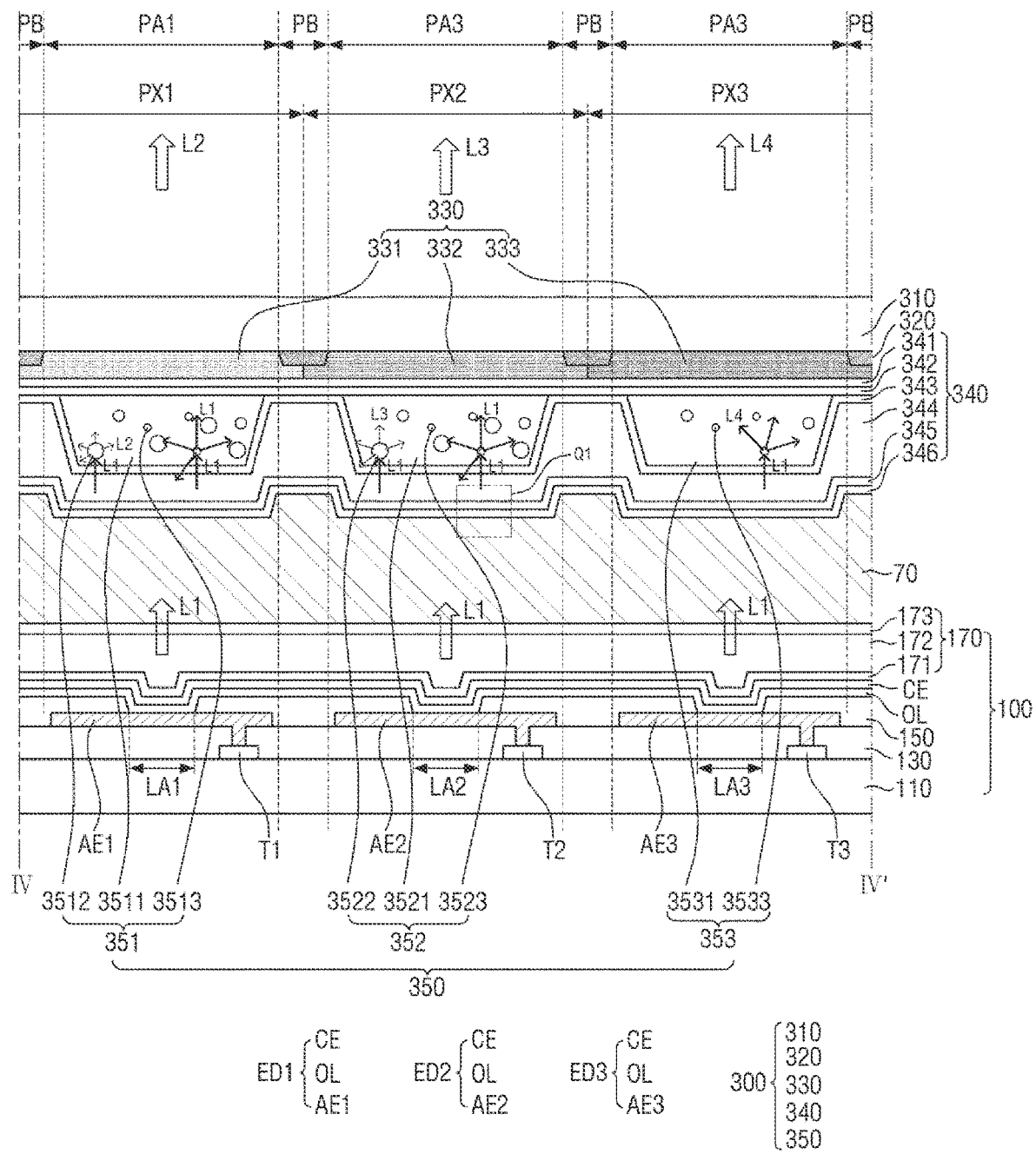
FIG. 4 is a cross-sectional view taken along the line IV-IV' of FIG. 3.
Figure 5:
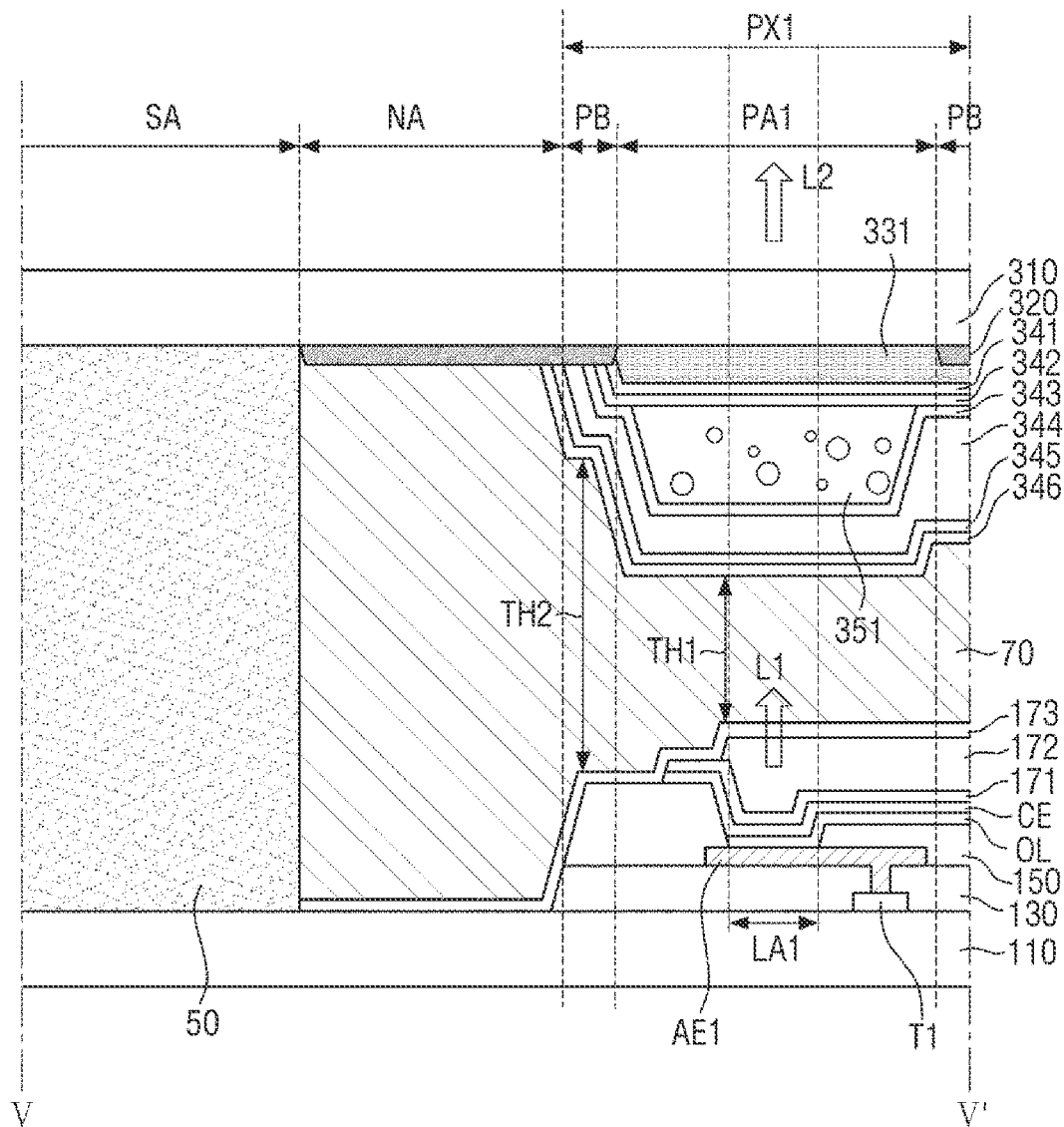
FIG. 5 is a cross-sectional view taken along the line V-V' of FIG. 3.
Figure 6A:
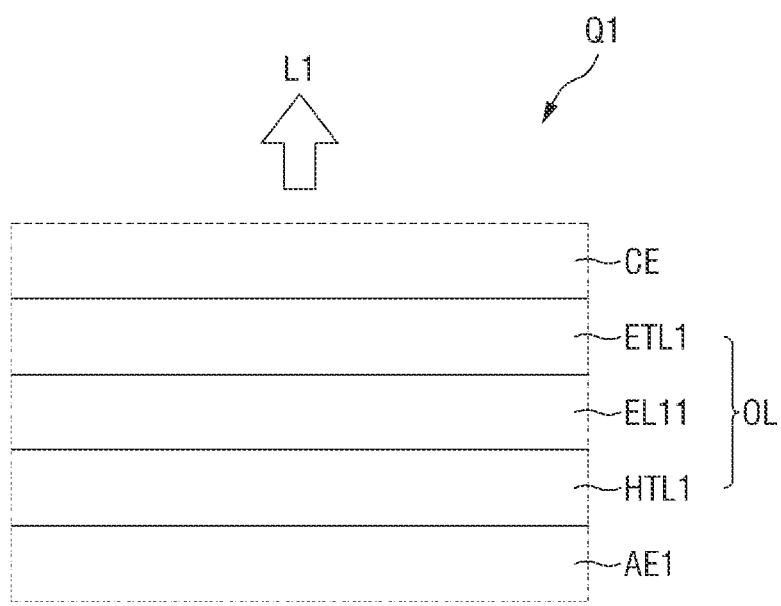
FIG. 6A is an enlarged cross-sectional view illustrating a part Q1 of FIG. 4.
Figure 6B:
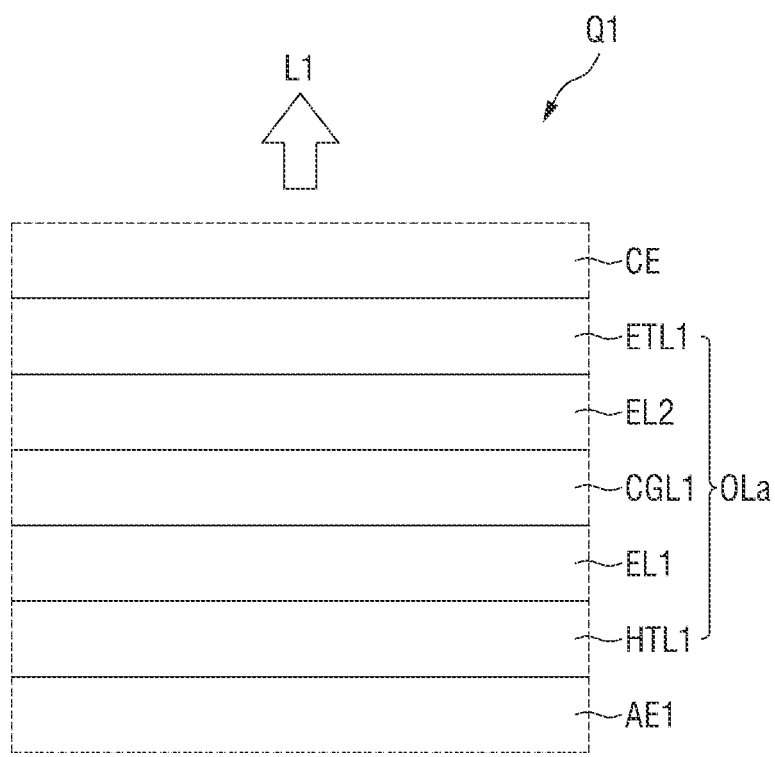
FIGS. 6B and 6C are enlarged cross-sectional views illustrating modified examples of the part Q1 of FIG. 4.
Figure 6C:
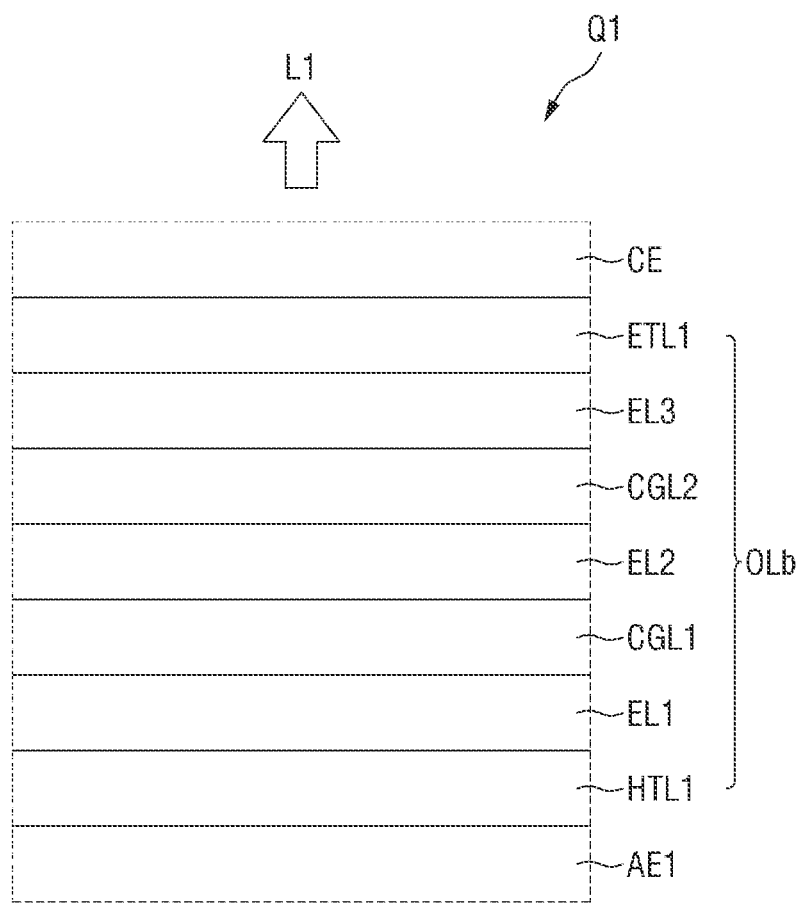
Figure 7:
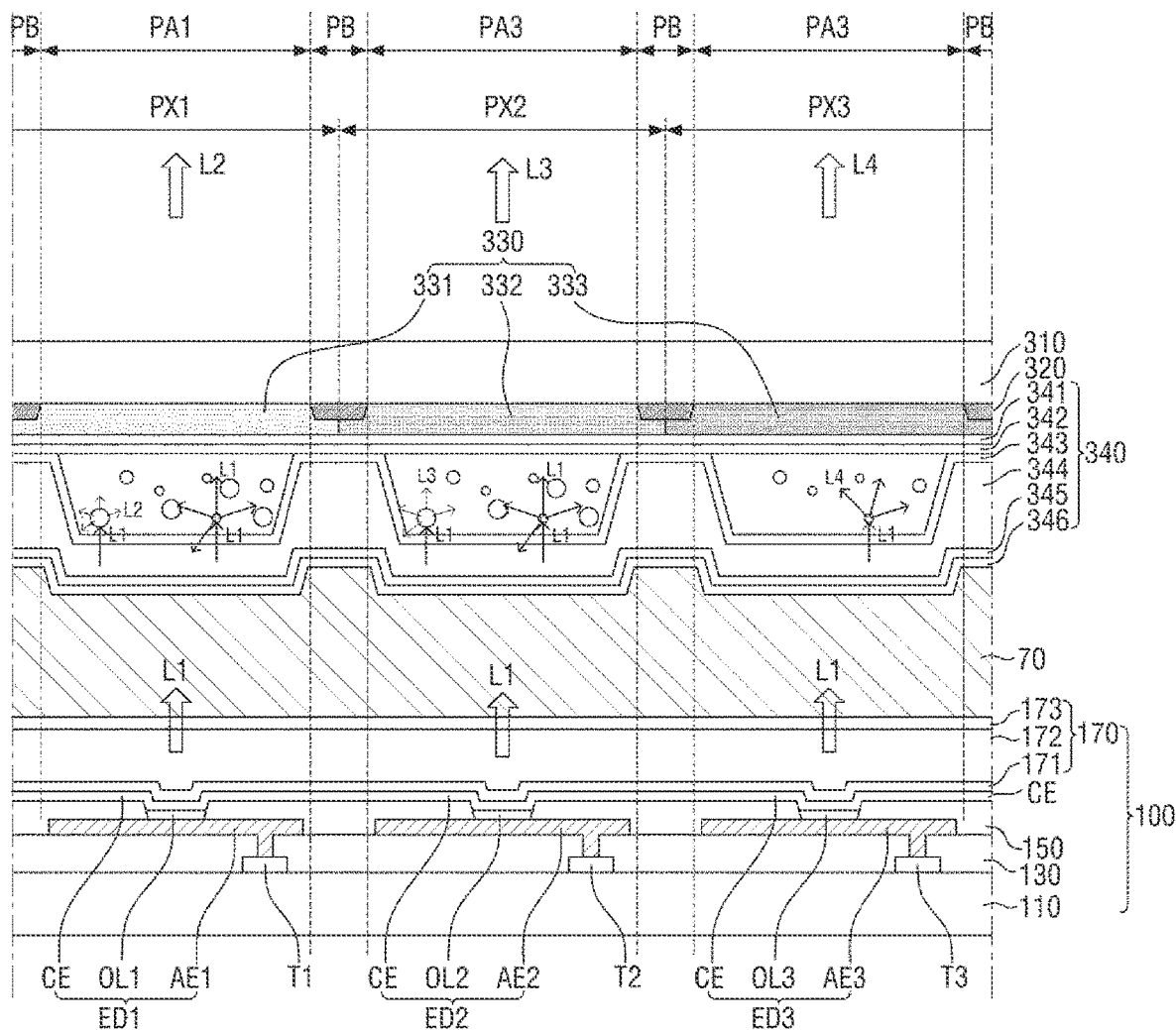
FIG. 7 is a cross-sectional view of a modified example of the display device according to the embodiment of FIG. 1.

FIG. 4 is a cross-sectional view taken along the line IV-IV' of FIG. 3, FIG. 5 is a cross-sectional view taken along the line V-V' of FIG. 3, FIG. 6A is an enlarged cross-sectional view illustrating a part Q1 of FIG. 4, FIGS. 6B and 6C are enlarged cross-sectional views illustrating modified examples of the part Q1 of FIG. 4, and FIG. 7 is a cross-sectional view of a modified example of the display device according to the embodiment of FIG. 1.

Referring to FIGS. 4 and 5, the display device 1 may include the light provider 100, the light converter 300, the sealing member 50, which is disposed between the light provider 100 and the light converter 300 to couple them together, and the filler material 70, which is disposed in the space surrounded by the light provider 100, the light converter 300, and the sealing member 50.

The light provider 100 will hereinafter be described.

The light provider 100 may include a first base substrate 110, first, second, and third switching elements T1, T2, and T3, an insulating film 130, a bank layer 150, first, second, and third OLEDs ED1, ED2, and ED3, and a thin-film encapsulation layer 170.

The first base substrate 110 may be formed of a light-transmitting material. The first base substrate 110 may be a glass substrate and/or a plastic substrate.

On the first base substrate 110, at least one switching element may be disposed in each pixel. For example, the first, second, and third switching elements TX1, TX2, and TX3 may be disposed in the first, second, and third pixels PX1, PX2, and PX3, respectively. Although not specifically illustrated, multiple signal lines (e.g., gate lines, data lines, power lines, and/or the like) may be further disposed on the first base substrate 110 to transmit signals to the first, second, and third switching elements T1, T2, and T3.

The insulating film 130 may be disposed on the first, second, and third switching elements T1, T2, and T3. The insulating film 130 may be formed as an organic film. For example, the insulating film 130 may include an acrylic resin, an epoxy resin, an imide resin, and/or an ester resin.

On the insulating film 130, first, second, and third pixel electrodes AE1, AE2, and AE3 may be disposed in the first, second, and third pixels PX1, PX2, and PX3, respectively. The first, second, and third pixel electrodes AE1, AE2, and AE3 may be disposed in the first, second, and third light emitting areas LA1, LA2, and LA3, respectively, and may at least partially expand into the non-light emitting areas. The first, second, and third pixel electrodes AE1, AE2, and AE3 may be connected to the first, second, and third switching elements T1, T2, and T3, respectively, via via holes that penetrate through the insulating film 130.

In one embodiment, the first, second, and third pixel electrodes AE1, AE2, and AE3 may be the anode electrodes of the first, second, and third OLEDs ED1, ED2, and ED3. The first, second, and third pixel electrodes AE1, AE2, and AE3 may include a high work function material that facilitates the injection of holes, such as, for example, indium tin oxide (ITO), indium zinc oxide (IZO), zinc oxide (ZnO), and/or indium oxide (In2O3). When the display device 1 is a top emission display device, the first, second, and third pixel electrodes AE1, AE2, and AE3 may further include a reflective metal layer. The reflective metal layer may include, for example, silver (Ag), magnesium (Mg), aluminum (Al), platinum (Pt), lead (Pb) palladium (Pd), gold (Au), nickel (Ni), neodymium (Nd), iridium (Ir), chromium (Cr), lithium (Li), calcium (Ca), or a mixture thereof. In some embodiments, the first, second, and third pixel electrodes AE1, AE2, and AE3 may have a double-layer structure such as ITO/Ag, Ag/ITO, ITO/Mg, or ITO/MgF, or a multilayer (e.g., three or more layer) structure such as ITO/Ag/ITO.

The bank layer 150 may be disposed on the first, second, and third pixel electrodes AE1, AE2, and AE3. The bank layer 150 may be disposed along the boundaries of each of the first, second, and third pixels PX1, PX2, and PX3. The bank layer 150 may be formed in a grid shape and may include openings that at least partially expose the first, second, and third pixel electrodes AE1, AE2, and AE3. As described above, the first, second, and third light emitting areas LA1, LA2, and LA3 may be distinguished from the non-light emitting areas by the bank layer 150. That is, parts of the first, second, and third pixel electrodes AE1, AE2, and AE3 that are not covered, but exposed by the bank layer 150 may form the first, second, and third light emitting areas LA1, LA2, and LA3, and parts of the first, second, and third pixel electrodes AE1, AE2, and AE3 that are covered by the bank layer 150 may become the non-light emitting areas.

In some embodiments, the bank layer 150 may include an organic insulating material such as an acrylic resin, an epoxy resin, a phenolic resin, a polyamide resin, a polyimide resin, an unsaturated polyester resin, a polyphenylene resin, a polyphenylene sulfide resin, and/or benzocyclobutene (BCB). An organic layer OL may be disposed on parts of (e.g., the portion of) the first, second, and third pixel electrodes AE1, AE2, and AE3 that are exposed by the openings of the bank layer 150. The organic layer OL will hereinafter be described with reference to FIGS. 6A through 6C and 7.

Referring to FIG. 6A, the organic layer OL may include a first hole transport layer HTL1 disposed on the first pixel electrode AE1, a first emission layer EU disposed on the first hole transport layer HTL1, and a first electron transport layer ETL1 disposed on the first emission layer EL1. In the embodiment of FIG. 6A, the organic layer OL may include only one emission layer, i.e., the first emission layer EL1, and the first emission layer EL1 may emit blue light L1. However, the stack structure of the organic layer OL is not particularly limited to that illustrated in FIG. 6A, but may vary, for example, as illustrated in FIGS. 6B and 6C.

For example, referring to FIG. 6B, an organic layer OLa may further include a first charge generation layer CGL1 disposed on a first emission layer EU and a second emission layer EL2 disposed on the first charge generation layer CGL1, and a first electron transport layer ETL1 may be disposed on the second emission layer EL2.

The first charge generation layer CGL1 may inject charges into each of the first and second emission layers EL1 and EL2. The first charge generation layer CGL1 may control the charge balance between the first and second emission layers EL1 and EL2. The first charge generation layer CGL1 may include n- and/or p-type charge generation layers. The p-type charge generation layer may be disposed on the n-type charge generation layer.

The first and second emission layers EU and EL2 may emit blue light having the same peak wavelength or may emit blue light having different peak wavelengths. Alternatively, the first and second emission layers EU and EL2 may emit light of different colors. That is, the first emission layer EU may emit blue light, and the second emission layer EL2 may emit green light.

Because the organic layer OLa includes two emission layers, the emission efficiency and life (e.g., lifespan) of the organic layer OLa can be improved as compared to those of the organic layer OL of FIG. 6A.

Referring to FIG. 6C, an organic layer OLb may include three emission layers, i.e., first, second, and third emission layers EL1, EL2, and EL3, and two charge generation layers interposed between the three emission layers, i.e., first and second charge generation layers CGL1 and CGL2. Specifically, the organic layer OLb may further include the first charge generation layer CGL1, which is disposed on the first emission layer EL1, the second emission layer EL2, which is disposed on the first charge generation layer CGL1, the second charge generation layer CGL2, which is disposed on the second emission layer EL2, and the third emission layer EL3, which is disposed on the second charge generation layer CGL2. A first electron transport layer ETL1 may be disposed on the third emission layer EL3.

The third emission layer EL3, like (e.g., similar to) the first and second emission layers EU and EL2, may emit blue light. In one embodiment, the first, second, and third emission layers EL1, EL2, and EL3 may each emit blue light, wherein the blue light emitted by the first, second, and third emission layers EL1, EL2, and EL3 may all have the same wavelength or some of the blue light emitted by the first, second, and third emission layers EL1, EL2, and EL3 may have different wavelengths. In another embodiment, the first, second, and third emission layers EL1, EL2, and EL3 may emit light of different colors. For example, the first, second, and third emission layers EL1, EL2, and EL3 may emit blue light or green light, or may emit red light, green light, and blue light so as to emit white light as a whole.

Referring again to FIG. 4, parts (e.g., some layers) of the organic layer OL on the first, second, and third pixel electrodes AE1, AE2, and AE3 may be connected to one another. Even if the parts of the organic layer OL on the first, second, and third pixel electrodes AE1, AE2, and AE3 are connected to one another, only parts (e.g., the portion) of the organic layer OL that are in contact with the first, second, and third pixel electrodes AE1, AE2, and AE3 may emit light. If the organic layer OL (e.g., some layers of the organic layer OL) is formed in common, instead of being divided for each pixel, parts (e.g., those layers) of the organic layer OL can be formed at the same time, which is desirable in terms of efficiency.

Referring to FIG. 7, separate organic layers, i.e., first, second, and third organic layers OL1, OL2, and OL3, may be formed for the first, second, and third pixels PX1, PX2, and PX3. For example, the first organic layer OL1, which is disposed on the first pixel electrode AE1, the second organic layer OL2, which is disposed on the second pixel electrode AE2, and the third organic layer OL3, which is disposed on the third pixel electrode AE3, are separated from one another. The first, second, and third organic layers OL1, OL2, and OL3 may be disposed on the parts of the first, second, and third pixel electrodes AE1, AE2, and AE3 that are exposed by the openings of the bank layer 150 and may thus be separated from one another by the bank layer 150. Because the first, second, and third organic layers OL1, OL2, and OL3 are separated on a pixel-by-pixel basis, the first, second, and third pixels PX1, PX2, and PX3 can be prevented or substantially prevented from accidentally emitting light because of a leakage current.

In some embodiments, some of the layers of each of the first, second and third organic layers OL1, OL2, and OL3 may be separated on a pixel-by-pixel basis, as illustrated in FIG. 7, and other layers of each of the first, second and third organic layers OL1, OL2, and OL3 may be formed in common for all the pixels, as illustrated in FIG. 4. For example, the emission layers of the first, second, and third organic layers OL1, OL2, and OL3 may be separated on a pixel-by-pixel basis, but the hole transport layers and/or the electron transport layers of the first, second, and third organic layers OL1, OL2, and OL3 may be formed as common layers for all the pixels.

Referring again to FIG. 4, when the first, second, and third pixel electrodes AE1, AE2, and AE3 are the anode electrodes of the first, second, and third OLEDs ED1, ED2, and ED3, a common electrode CE may be the cathode electrodes of the first, second, and third OLEDs ED1, ED2, and ED3, and may include a low work function material that facilitates the injection of electrons, such as, for example, Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg).

When the display device 1 is a top emission display device, the common electrode CE may have transparency or semitransparency (i.e., may be transparent or semitransparent). When the common electrode CE is formed by depositing the low work function material to a thin thickness of several tens to several hundreds of Å, the common electrode CE may have transparency or semitransparency. When a low work function metal film is utilized to form the common electrode CE, the common electrode CE may further include a transparent conductive material layer deposited on the low work function metal film and including, for example, tungsten oxide (WxOx), titanium oxide ($TiO_2$), indium tin oxide (ITO), indium zinc oxide (IZO), zinc oxide (ZnO), indium tin zinc oxide (ITZO), and/or magnesium oxide (MgO), in order to secure (e.g., enhance) transparency and to lower resistance (e.g., electrical resistance).

The first pixel electrode AE1, the organic layer OL, and the common electrode CE may form the first OLED ED1; the second pixel electrode AE2, the organic layer OL, and the common electrode CE may form the second OLED ED2; and the third pixel electrode AE3, the organic layer OL, and the common electrode CE may form the third OLED ED3.

The thin-film encapsulation layer 170 may be disposed on the common electrode CE. In order to prevent or substantially prevent external impurities or moisture from infiltrating into the first, second, and third OLEDs ED1, ED2, and ED3, the thin-film encapsulation layer 170 may be disposed on the first, second, and third OLEDs ED1, ED2, and ED3 to seal the light provider 100.

The thin-film encapsulation layer 170 may be formed on the entire surface of the display device 1 regardless of the distinction between the first, second, and third pixels PX1, PX2, and PX3. The thin-film encapsulation layer 170 may be disposed to extend to even a part of the non-display area NA, as illustrated in FIG. 5. Although not specifically illustrated, one or more capping layers may be further disposed between the thin-film encapsulation layer 170 and the common electrode CE to cover the common electrode CE, in which case, the thin-film encapsulation layer 170 may directly cover the capping layers.

The thin-film encapsulation layer 170 may cover the first, second, and third OLEDs ED1, ED2, and ED3, including the common electrode CE. The first, second, and third OLEDs ED1, ED2, and ED3 may be surrounded and sealed by the first base substrate 110 and the thin-film encapsulation layer 170.

The thin-film encapsulation layer 170 may include a first encapsulation inorganic film 171, an encapsulation organic film 172, and a second encapsulation inorganic film 173 that are sequentially stacked on the common electrode CE.

The first and second encapsulation inorganic films 171 and 173 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and/or lithium fluoride.

The encapsulation organic film 172 may be formed of an acrylic resin, a methacrylic resin, a polyisoprene, a vinyl resin, an epoxy resin, a urethane resin, a cellulose resin, and/or a perylene resin.

The first encapsulation inorganic film 171 may be disposed on the common electrode CE. The common electrode CE may reflect (e.g., conformally reflect) the underlying height differences and may thus have surface unevenness. The first encapsulation inorganic film 171 may be formed of an inorganic material and may thus conformally reflect at least some of the surface unevenness of the common electrode CE. Accordingly, the first encapsulation inorganic film 171, like (e.g., similar to) the common electrode CE, may have surface unevenness.

The encapsulation organic film 172 may be disposed on the first encapsulation inorganic film 171. The encapsulation organic film 172 may alleviate or planarize the underlying height differences by filling the surface unevenness of the first encapsulation inorganic film 171.

The second encapsulation inorganic film 173 may be disposed on the encapsulation organic film 172.

The first and second encapsulation inorganic films 171 and 173 may be in direct contact with each other at the edges thereof. For example, if the first and second encapsulation inorganic films 171 and 173 are larger in size than the encapsulation organic film 172 in a plan view, the encapsulation organic film 172 can be completely sealed by the first and second encapsulation inorganic films 171 and 173. FIG. 5 illustrates that the second encapsulation inorganic film 173 extends outwardly beyond the first encapsulation inorganic film 171, but the present disclosure is not limited thereto. Alternatively, the first encapsulation inorganic film 171 may extend outwardly beyond the second encapsulation inorganic film 173. Still alternatively, the first and second encapsulation inorganic films 171 and 173 may have the same size in a plan view and may thus be aligned with each other on the sides thereof.

The light converter 300 will hereinafter be described. The light converter 300 may include a second base substrate 310, a light-shielding member (e.g., light shield) 320, first, second, and third color filters 331, 332, and 333, light conversion patterns 350, and a plurality of capping layers 341 through 346 that are stacked over one another.

The second base substrate 310 faces the first base substrate 110. The second base substrate 310 may include at least one of the aforementioned examples of the material of the first base substrate 110.

The light-shielding member 320 may be disposed on a surface of the second base substrate 310 that faces (e.g., is directed toward) the light provider 100 (i.e., a downward direction of FIG. 4). The light-shielding member 320 may be disposed along the boundaries between the first, second, and third light output areas PA1, PA2, and PA3, i.e., in the non-light output areas PB, and may block the transmission of light therethrough. The light-shielding member 320 may prevent or substantially prevent the mixing of the colors from the first, second, and third pixels PX1, PX2, and PX3.

The light-shielding member 320, like (i.e., similar to) the non-light output areas PB, may be arranged in a grid fashion in a plan view. The light-shielding member 320 may at least partially overlap with the bank layer 150 of the light provider 100 in the thickness direction.

The light-shielding member 320 may include at least one of an organic material, a metal material including chromium, and carbon black.

Color filters 330 may be disposed on the second base substrate 310. The color filters 330 may include the first, second, and third color filters 331, 332, and 333. The first, second, and third color filters 331, 332, and 333 may be absorptive filters that absorb light of a set or predetermined wavelength while transmitting light of another set or predetermined wavelength therethrough.

The first, second, and third color filters 331, 332, and 333 may be disposed in the first, second, and third light output areas PA1, PA2, and PA3, respectively. The locations of the first, second, and third color filters 331, 332, and 333 are not particularly limited, and the first, second, and third color filters 331, 332, and 333 may partially extend to even the light-shielding member 320 and may thus be disposed on the light-shielding member 320.

Between blue light L1 and red light L2 emitted by a first wavelength conversion pattern 351, the first color filter 331 may block or absorb the blue light L1. That is, the first color filter 331 may serve as a blue light blocking filter blocking blue light, and may also serve as a red-light-transmitting filter selectively transmitting the red light L2 therethrough. The first color filter 331 may include a red colorant.

Between blue light L1 and green light L3 emitted by a second wavelength conversion pattern 352, the second color filter 332 may block or absorb the blue light L1. That is, the second color filter 332 may serve as a blue light blocking filter blocking blue light, and may also serve as a green-light-transmitting filter selectively transmitting the green light L3 therethrough. The second color filter 332 may include a green colorant.

The third color filter 333 may transmit blue light L4 emitted by a light-transmitting pattern 353, which will be described in more detail later. That is, the third color filter 333 may serve as a blue-light-transmitting filter. The third color filter 333 may include a blue colorant.

The first, second, and third color filters 331, 332, and 333 may absorb at least some light incident thereupon from the outside. For example, because the first color filter 331 can serve as a red-light-transmitting filter, the first color filter 331 may block at least some external light other than red light. Also, because the second color filter 332 can serve as a green-light-transmitting filter, the second color filter 332 may block at least some external light other than green light. Also, because the third color filter 333 can serve as a blue-light-transmitting filter, the third color filter 333 may block at least some external light other than blue light. In this manner, the first, second, and third color filters 331, 332, and 333 can improve the reflection of external light.

A first capping layer 341 may be disposed on the first, second, and third color filters 331, 332, and 333. The first capping layer 341 may be disposed on the entire surfaces of the first, second, and third color filters 331, 332, and 333.

The first capping layer 341 may prevent or substantially prevent the first, second, and third color filters 331, 332, and 333 from being damaged by, or contaminated with, impurities such as external moisture or air. Also, the first capping layer 341 may prevent or substantially prevent the colorants of the first, second, and third color filters 331, 332, and 333 from diffusing into and/or infiltrating into regions other than the regions where the first, second, and third color filters 331, 332, and 333 are disposed.

A second capping layer 342 may be disposed on the first capping layer 341. The second capping layer 342 may be disposed to cover the first capping layer 341. The second capping layer 342 may prevent or substantially prevent the first, second, and third color filters 331, 332, and 333 from being damaged by, or contaminated with, impurities such as external moisture or air. Also, the second capping layer 342 may, together with a third capping layer 343, which will be described in more detail later, seal the first wavelength conversion pattern 351, the second wavelength conversion pattern 352, and the light-transmitting pattern 353, and may thus prevent or substantially prevent external moisture or air from infiltrating into the first wavelength conversion pattern 351, the second wavelength conversion pattern 352, and the light-transmitting pattern 353.

The first and second capping layers 341 and 342 may be formed of an inorganic material. For example, the first and second capping layers 341 and 342 may include silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

The light conversion patterns 350 may be disposed on the first and second capping layers 341 and 342. The light conversion patterns 350 may include the first wavelength conversion pattern 351, the second wavelength conversion pattern 352, and the light-transmitting pattern 353.

The first wavelength conversion pattern 351 may be disposed in the first light output area PA1. The first wavelength conversion pattern 351 may be disposed in the first light output area PA1, but not in the second and third light output areas PA2 and PA3. The first wavelength conversion pattern 351 may convert or shift the peak wavelength of incident light into a set or predetermined peak wavelength and may emit the resulting light. The first wavelength conversion pattern 351 may convert blue light L1 into red light L2 and may emit the red light L2.

The first wavelength conversion pattern 351 may include a first base resin 3511 and a first wavelength shifter 3512 dispersed in the first base resin 3511, and may further include a first scatterer 3513 dispersed in the first base resin 3511.

The material of the first base resin 3511 is not particularly limited as long as it has high light transmittance and has suitable (e.g., excellent) dispersion characteristics for the first wavelength shifter 3512 and the first scatterer 3513. For example, the first base resin 3511 may include an organic material such as an epoxy resin, an acrylic resin, a cardo resin and/or an imide resin.

The first wavelength shifter 3512 may convert or shift the peak wavelength of incident light into a set or predetermined peak wavelength. Examples of the first wavelength shifter 3512 include quantum dots, quantum rods, and a phosphor. For example, the quantum dots are a particulate matter (e.g., material) that emits light of a particular (e.g., specific) color in response to the transition of the electrons from the conduction band to the valence band.

The quantum dots may be a semiconductor nanocrystal material. The quantum dots may have a particular (e.g., specific) band gap depending on their composition and/or size. The quantum dots may absorb light and may then emit light of a unique wavelength. Examples of the semiconductor nanocrystal material include a Group IV nanocrystal material, a Group II-VI compound nanocrystal material, a Group III-V compound nanocrystal material, a Group IV-VI nanocrystal material, and a combination thereof.

For example, the Group IV nanocrystal material may be silicon (Si), germanium (Ge) or a binary compound such as silicon carbide (SiC) and/or silicon germanium (SiGe), but the present disclosure is not limited thereto.

Also, the Group II-VI compound nanocrystal material may be a binary compound such as CdSe, CdTe, ZnS, ZnSe, ZnTe, ZnO, HgS, HgSe, HgTe, MgSe, MgS, or a mixture thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and/or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but the present disclosure is not limited thereto.

Also, the Group III-V compound nanocrystal material may be a binary compound such as GaN, GaP, GaAs, GaSb, AlN, AlP, AlAs, AlSb, InN, InP, InAs, InSb, or a mixture thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; and/or a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, but the present disclosure is not limited thereto.

Also, the Group IV-VI nanocrystal material may be a binary compound such as SnS, SnSe, SnTe, PbS, PbSe, PbTe, or a mixture thereof; a ternary compound such as SnSeS, SnSeTe, SnSTe, PbSeS, PbSeTe, PbSTe, SnPbS, SnPbSe, SnPbTe, or a mixture thereof; and/or a quaternary compound such as SnPbSSe, SnPbSeTe, SnPbSTe, or a combination thereof, but the present disclosure is not limited thereto.

The quantum dots may have a core-shell structure and may include (e.g., consist of) cores including the aforementioned nanocrystal material and shells surrounding the cores. The shells of the quantum dots may perform the functions of a protective layer for preventing or substantially preventing chemical denaturation of the cores to maintain semiconductor characteristics and/or perform the functions of a charging layer for imparting electrophoretic characteristics to the quantum dots. The shells of the quantum dots may have a single-layer or multilayer structure. Examples of the shells of the quantum dots include an oxide of a metal or nonmetal, a semiconductor compound, and a combination thereof.

For example, the metal or nonmetal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or a ternary compound such as $MgAl_2O_4$, $CoFe_2O_4$, $NiFe_2O_4$, and/or $CoMn_2O_4$, but the present disclosure is not limited thereto.

Also, the semiconductor compound may be CdS, CdSe, CdTe, ZnS, ZnSe, ZnTe, GaAs, GaP, GaSb, HgS, HgSe, HgTe, InAs, InP, InSb, AlAs, AlP, and/or AlSb, but the present disclosure is not limited thereto.

Light emitted by the first wavelength shifter 3512 may have an emission wavelength spectrum with a half bandwidth of about 45 nm or less, about 40 nm or less, or about 30 nm or less, and as a result, the purity and the reproducibility of colors displayed by the display device 1 can be further improved. Also, the first wavelength shifter 3512 can emit light in various directions regardless of the incident direction of the light. Accordingly, the lateral visibility of red light L2 displayed in the first light output area PA1 can be improved.

Some of the blue light L1 provided by the first light emitting area LA1 may be emitted through the first wavelength conversion pattern 351 without being converted into red light L2 by the first wavelength shifter 3512. Blue light L1 incident upon the first color filter 331 without being converted by the first wavelength conversion pattern 351 may be blocked by the first color filter 331. On the other hand, some blue light L1 may be converted into red light L2 by the first wavelength conversion pattern 351, and this red light L2 may be emitted to the outside through the first color filter 331.

The first scatterer 3513 may have a different refractive index from the first base resin 3511 and may form an optical interface with the first base resin 3511. For example, the first scatterer 3513 may be light scattering particles. The material of the first scatterer 3513 is not particularly limited as long as it is capable of scattering at least some light passing therethrough. For example, the first scatterer 3513 may be particles of a metal oxide and/or particles of an organic material. Examples of the metal oxide include titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), and tin oxide ($SnO_2$), and examples of the organic material include an acrylic resin and a urethane resin.

The first scatterer 3513 may scatter incident light in random directions, regardless of the incident direction of the incident light, without substantially changing the wavelength of light passing through the first wavelength conversion pattern 351. As a result, the path of light passing through the first wavelength conversion pattern 351 can be lengthened, and the color conversion efficiency of the first wavelength shifter 3512 can be improved.

The first wavelength conversion pattern 351 may have a thickness of 3 μm to 15 μm. When the first wavelength conversion pattern 351 is formed to a thickness of 3 μm or greater, the efficiency of converting the color of light passing through the first wavelength conversion pattern 351 can be improved. The upper limit of the thickness of the first wavelength conversion pattern 351 may, for example, preferably be about 15 μm for the ease of processing.

The content of the first wavelength shifter 3512 in the first wavelength conversion pattern 351 may be 10% to 60% (e.g., based on the total weight of the first wavelength conversion pattern 351). The content of the first scatterer 3513 in the first wavelength conversion pattern 351 may be 2% to 10% (e.g., based on the total weight of the first wavelength conversion pattern 351).

The second wavelength conversion pattern 352 may be disposed in the second light output area PA2. The second wavelength conversion pattern 352 may be disposed only in the second light output area PA2, but not in the first and third light output areas PA1 and PA3. The second wavelength conversion pattern 352 may convert or shift the peak wavelength of incident light into a set or predetermined peak wavelength and may emit the resulting light. The second wavelength conversion pattern 352 may convert blue light L1 into green light L3 having a wavelength of about 510 nm to about 550 nm.

The second wavelength conversion pattern 352 may include a second base resin 3521 and a second wavelength shifter 3522 dispersed in the second base resin 3521, and may further include a second scatterer 3523 dispersed in the second base resin 3521.

The second base resin 3521 may be formed of the same material as the first base resin 3511, or may include at least one of the aforementioned examples of the material of the first base resin 3511.

The second wavelength shifter 3522 may convert or shift the peak wavelength of incident light into a set or predetermined peak wavelength. The second wavelength shifter 3522 may convert blue light L1 having a peak wavelength of 430 nm to 470 nm into green light L2 having a peak wavelength of 510 nm to 550 nm. Some of the blue light L1 may be emitted through the first wavelength conversion pattern 351 without being converted into green light L3 by the second wavelength shifter 3522, and this blue light L1 may be blocked by the second color filter 332. Some of the blue light L1 may be converted into green light L2 by the second wavelength conversion pattern 352, and this green light L2 may be emitted through the second color filter 332.

Examples of the second wavelength shifter 3522 include quantum dots, quantum rods, and a phosphor. The second wavelength shifter 3522 may be substantially the same as the first wavelength shifter 3512, and thus, a detailed description thereof will not be repeated.

The first and second wavelength shifters 3512 and 3522 may both include quantum dots. In this case, the diameter of the quantum dots of the first wavelength shifter 3512 may be greater than the diameter of the quantum dots of the second wavelength shifter 3522.

The second scatterer 3523 may have a different refractive index from the second base resin 3521, and may form an optical interface with the second base resin 3521. For example, the second scatterer 3523 may be light scattering particles. The second scatterer 3523 is substantially the same as the first scatterer 3513, and thus, a detailed description thereof will not be repeated.

The thickness of the second wavelength conversion pattern 352 may be substantially the same as the thickness of the first wavelength conversion pattern 351.

The content of the second wavelength shifter 3522 in the second wavelength conversion pattern 352 may be 10% to 60% (e.g., based on the total weight of the second wavelength conversion pattern 352). The content of the second scatterer 3523 in the second wavelength conversion pattern 352 may be 2% to 10% (e.g., based on the total weight of the second wavelength conversion pattern 352).

The light-transmitting pattern 353 may be disposed in the third light output area PA3. The light-transmitting pattern 353 may be disposed only in the third light output area PA3, but not in the first and second light output areas PA1 and PA2. The light-transmitting pattern 353 may transmit incident light therethrough. For example, the light-transmitting pattern 353 may transmit blue light L1 provided thereto therethrough. The light-transmitting pattern 353 may include a third scatterer 3533 and may thus randomly scatter the blue light L1 in arbitrary directions.

The light-transmitting pattern 353 may include a third base resin 3531 and a third scatterer 3533 dispersed in the third base resin 3531.

The third base resin 3531 may be formed of the same material as the first base resin 3511, or may include at least one of the aforementioned examples of the material of the first base resin 3511.

The third scatterer 3533 may have a different refractive index from the third base resin 3531, and may form an optical interface with the third base resin 3531. For example, the third scatterer 3533 may be light scattering particles. The third scatterer 3533 is substantially the same as the first scatterer 3513, and thus, a detailed description thereof will not be repeated.

Blue light L1 provided by the third OLED ED3 may pass through the light-transmitting pattern 353 and may be emitted from the third pixel PX3 as blue light L4.

The light conversion patterns 350 may protrude in the thickness direction. For example, the light conversion patterns 350 may protrude in a third direction DR3, i.e., a direction facing the light provider 100. The heights of the first wavelength conversion pattern 351, the second wavelength conversion pattern 352, and the light-transmitting pattern 353 with respect to the bottom surfaces of the light conversion patterns 350 that are in contact with the second capping layer 342 may be substantially the same, but the present disclosure is not limited thereto. Alternatively, all or some of the heights of the first wavelength conversion pattern 351, the second wavelength conversion pattern 352, and the light-transmitting pattern 353 with respect to the bottom surfaces of the light conversion patterns 350 may differ.

The light conversion patterns 350 may include the first wavelength conversion pattern 351, the second wavelength conversion pattern 352, and the light-transmitting pattern 353, which protrude toward the light provider 100, and the first wavelength conversion pattern 351, the second wavelength conversion pattern 352, and the light-transmitting pattern 353 may be isolated from one another. The surfaces of the light conversion patterns 350 may include height differences. For example, regions where the light conversion patterns 350 are disposed may protrude toward the light provider 100, and regions where the light conversion patterns 350 are not disposed may be recessed away from the light provider 100.

The third capping layer 343 may be disposed on the light conversion patterns 350. The third capping layer 343 may cover the light conversion patterns 350.

The third capping layer 343 may include an inorganic material. The third capping layer 343 may be formed of the same material as the first capping layer 341, or may include at least one of the aforementioned examples of the material of the first capping layer 341. In one embodiment, the third capping layer 343 may include silicon nitride. The third capping layer 343 may reflect (e.g., conformally reflect) the height differences generated by the surfaces of the light conversion patterns 350, and as a result, a surface of the third capping layer 343 facing the light provider 100 may be uneven. That is, one or both surfaces of the third capping layer 343 may include convex parts in regions that overlap with the light conversion patterns 350 in the thickness direction and concave parts in regions that do not overlap with the light conversion patterns 350 in the thickness direction.

The third capping layer 343, together with the second capping layer 342, may seal the first and second wavelength conversion patterns 351 and 352, and can thus prevent or substantially prevent the first and second wavelength conversion patterns 351 and 352 from being damaged by, or contaminated with, external impurities such as moisture or air.

An interlayer organic layer 344 may be further disposed on the third capping layer 343. The interlayer organic layer 344 may be a planarization layer including an organic material. The interlayer organic layer 344 may be disposed on the surface of the third capping layer 343 that faces the light provider 100, i.e., on both the convex parts and the concave parts of the third capping layer 343. The interlayer organic layer 344 may fill at least some of the concave parts of the third capping layer 343. The surface of parts (e.g., portions) of the interlayer organic layer 344 that overlaps with the convex parts of the third capping layer 343 and the surface of parts (e.g., portions) of the interlayer organic layer 344 that overlaps with the concave parts of the third capping layer 343 may not be completely flat. For example, the interlayer organic layer 344 may be flatter in regions that overlap with the convex parts of the third capping layer 343 than in regions that overlap with the concave parts of the third capping layer 343. Also, the interlayer organic layer 344 may be more recessed away from the light provider 100 in the regions that overlap with the concave parts of the third capping layer 343 than in the regions that overlap with the convex parts of the third capping layer 343.

A fifth capping layer 345 may be disposed on the interlayer organic layer 344. The fifth capping layer 345 may be formed of an inorganic material such as silicon oxide, silicon nitride, and/or silicon oxynitride.

The fifth capping layer 345 may be disposed on flat parts and non-flat parts of the interlayer organic layer 344. In regions that overlap with the non-flat parts of the interlayer organic layer 344, the fifth capping layer 345 may reflect (e.g., conformally reflect) the recesses on the interlayer organic layer 344 and may thus include surface unevenness. That is, the fifth capping layer 345 may include convex parts in regions that overlap with the flat parts of the interlayer organic layer 344 and may include concave parts in the regions that overlap with the non-flat parts of the interlayer organic layer 344.

A sixth capping layer 346 may be disposed on the fifth capping layer 345. The sixth capping layer 346 may reflect (e.g., conformally reflect) the surface unevenness of the fifth capping layer 345 and may thus include surface unevenness. That is, the sixth capping layer 346 may include convex parts in regions that overlap with the convex parts of the fifth capping layer 345 and may include concave parts in regions that overlap with the concave parts of the fifth capping layer 345.

In one embodiment, the sixth capping layer 346 may include an oxide-rich metal or non-metal oxide. The sixth capping layer 346 may include a metal or non-metal central atom, and oxygen and nitrogen atoms covalently bonded to the central atom. In one embodiment, the oxygen content ratio of the sixth capping layer 346 may be greater than the nitrogen content ratio of the sixth capping layer 346.

The sixth capping layer 346 may be located in the outermost layer of the light converter 300. The sixth capping layer 346 may be disposed in regions that are in direct contact with the filler material 70. For example, the sixth capping layer 346 may be an outermost inorganic layer including an inorganic material (e.g., element) as a central atom.

When the sixth capping layer 346 is provided at the outermost part of the light converter 300 (adjacent to the filler material 70) as, for example, an outermost inorganic layer, the adhesion of the filler material 70 to the surface of the light converter 300 can be improved. The structure and the benefits of the sixth capping layer 346 will be described in more detail later.

The sixth capping layer 346 has been described above as being included in the light converter 300, but the present disclosure is not limited thereto. That is, alternatively, the sixth capping layer 346 may be disposed below the light converter 300 as a separate element, in which case, the sixth capping layer 346 may be disposed between the filler material 70 and the light converter 300 and may thus be in direct contact with the light converter 300.

The sealing member (e.g., sealant) 50 may be disposed between the first base substrate 110 of the light provider 100 and the second base substrate 310 of the light converter 300. The sealing member 50 may be in contact with two opposite surfaces (e.g., two surfaces facing each other) of the first and second base substrates 110 and 310. That is, the two opposite surfaces of the first and second base substrates 110 and 310 may be coupled to each other via the sealing member 50.

In one embodiment, the sealing member 50 may be formed on the first base substrate 110 first, and the second base substrate 310 may be attached to the sealing member 50. In another embodiment, the sealing member 50 may be formed on the second base substrate 310 first, and the first base substrate 110 may be attached to the sealing member 50.

In one embodiment, outer side surfaces of the sealing member 50 may be aligned with the side surfaces of the light provider 100 and the side surfaces of the light converter 300 in the thickness direction, as illustrated in FIGS. 2 and 5. In a cross-sectional view, the outer side surfaces of the sealing member 50 may have a rectilinear shape in the thickness direction. The inner side surfaces of the sealing member 50, which are opposite to the outer side surfaces of the sealing member 50, may be disposed on the inside of the outer side surfaces of the sealing member 50 and may be in partial contact with the filler material 70. In a cross-sectional view, the inner side surfaces of the sealing member 50, like (e.g., similar to) the outer side surfaces of the sealing member 50, may have a rectilinear shape in the thickness direction.

The filler material 70 may be in partial contact with the thin-film encapsulation layer 170 and the first base substrate 110 of the light provider 100, and may also be in partial contact with the sixth capping layer 346 of the light converter 300 and the light-shielding member 320 of the light converter 300, which is disposed between the first light output area PA1 and the sealing area SA. The filler material 70 may also be in partial contact with the inner side surfaces of the sealing member 50.

As described above, in the non-light output areas PB, the light converter 300 may be recessed in an upward direction, i.e., in a display direction, and may protrude beyond the filler material 70 along the display direction. That is, the sixth capping layer 346, which is disposed in the outermost layer of the light converter 300 that faces the filler material 70, may have surface unevenness including concave parts in the non-light output areas PB and convex parts in the first, second, and third light output areas PA1, PA2, and PA3. The light converter 300 may generally have a relatively non-flat surface in the non-light output areas PB than in the first, second, and third light output areas PA1, PA2, and PA3.

The filler material 70 may planarize the surface unevenness of the light converter 300. That is, the filler material 70 may fill (e.g., in the concave) parts of the light converter 300 that are recessed in the upward direction or the display direction in the non-light output areas PB. The filler material 70 may also fill the concave parts of the sixth capping layer 346 in the non-light emitting areas PD (e.g., non-light output areas PB). Accordingly, the filler material 70 can planarize (e.g., fill) the unevenness on the surface of the light converter 300 that faces the light provider 100 and can thus prevent or substantially prevent the elements of the light provider 100 from being physically damaged by any height differences on the surface of the light converter 300.

Also, because the filler material 70 is formed of a material having a buffer function, the filler material 70 can serve as a buffer member (e.g., a buffer) capable of absorbing impact generated between the light provider 100 and the light converter 300.

The filler material 70 may have a refractive index of about 1.4 to 1.6. As will be described in more detail later, the difference between the refractive index of the filler material 70 and the refractive index of the sixth capping layer 346, which is in partial contact with the filler material 70, may be less than or equal to about 0.2.

For example, the filler material 70 may have a first thickness TH1 in the first, second, and third light out areas PA1, PA2, and PA3 and a second thickness TH2 in the non-light output areas PB. The second thickness TH2 may be greater than the first thickness TH1. The first thickness TH1 may be about 2 μm to about 7 μm (e.g., the first thickness TH1 may be about 2 μm or about 7 μm). The second thickness TH2 may be about 3 μm to about 9 μm (e.g., the second thickness TH2 may be about 3 μm or about 9 μm).

Figure 8:
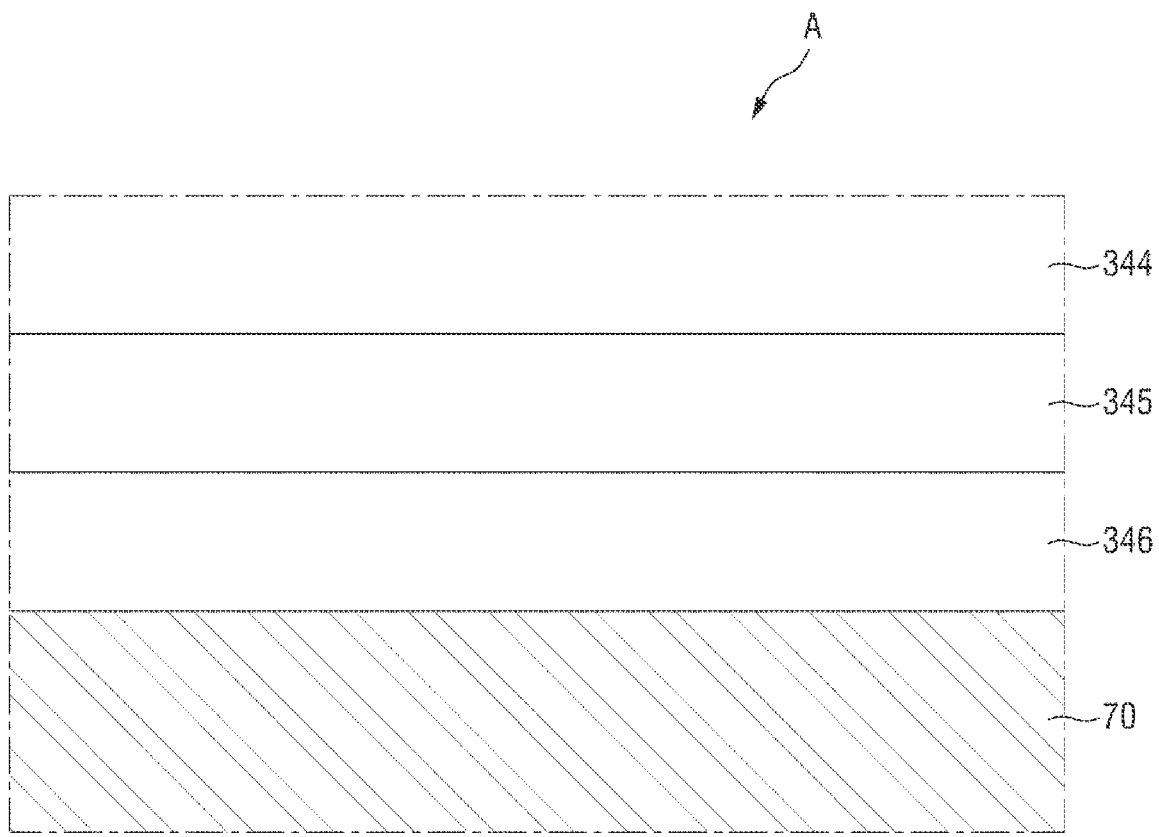
FIG. 8 is an enlarged cross-sectional view illustrating an area A of FIG. 4.
Figure 9:
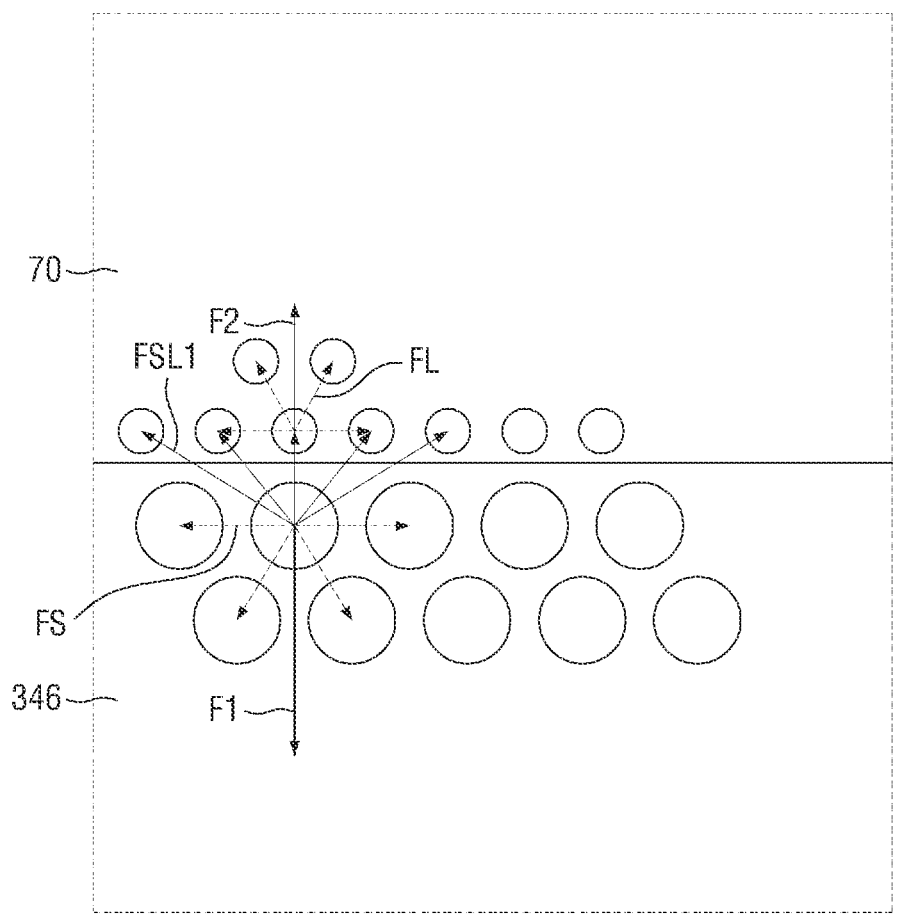
FIG. 9 is an enlarged cross-sectional view illustrating a sixth capping layer and a filler material of FIG. 8.

FIG. 8 is an enlarged cross-sectional view illustrating an area A of FIG. 4, and FIG. 9 is an enlarged cross-sectional view illustrating the sixth capping layer 346 and the filler material 70 of FIG. 8.

Referring to FIGS. 8 and 9, the material for the sixth capping layer 346 may include an oxide-rich metal or non-metal oxide. The material for the sixth capping layer 346 may include a metal or non-metal central atom, and oxygen and nitrogen atoms covalently bonded to the central atom. In one embodiment, the oxygen content ratio of the sixth capping layer 346 may be greater than the nitrogen content ratio of the sixth capping layer 346.

The sixth capping layer 346 may include multiple materials having the formula $AO_XN_Y$. Referring to the formula $AO_XN_Y$, A denotes the central atom of the material for the sixth capping layer 346. The central atom A may include a metal or non-metal central atom. When the central atom A includes a metal central atom, the central atom A may include aluminum (Al). When the central atom A includes a non-metal central atom, the central atom A may include silicon (Si). Referring again to the formula $AO_XN_Y$, X denotes a first content, which is the content of oxygen in one molecule of the corresponding material, and Y denotes a second content, which is the content of nitrogen in one molecule of the corresponding material. The first and second contents X and Y may both be greater than 0 and less than 1. The relationship between the first and second contents X and Y may represent the relationship between the contents of oxygen and nitrogen in one molecule of the sixth capping layer 346. In one embodiment, the first content X may be greater than the second content Y. That is, in one molecule of the sixth capping layer 346, the content of oxygen may be greater than the content of nitrogen. In one embodiment, the sixth capping layer 346 may include silicon as the central atom A.

The sixth capping layer 346 may be deposited on the fifth capping layer 345 of the light converter 300 via a plasma enhanced chemical vapor deposition (PECVD) process. The PECVD process may be performed at a temperature of about 70° C. to about 300° C.

The temperature of the PECVD process may be determined in consideration of efficiency and the thermal vulnerability of elements disposed adjacent to a target object. For example, the PECVD process may be performed at a temperature of about 150° C. or higher in consideration of efficiency. Also, the PECVD process may be performed at a temperature of about 250° C. or lower in consideration of the thermal vulnerability of elements disposed near the sixth capping layer 346, e.g., the first and second wavelength conversion patterns 351 and 352. Thus, a deposition process for forming the sixth capping layer 346 may, for example, preferably be performed at a temperature of about 150° C. to 250° C. in consideration of both efficiency and thermal vulnerability, but the present disclosure is not limited thereto. Alternatively, the deposition process for forming the sixth capping layer 346 may, for example, preferably be performed at a temperature of 250° C. or higher in consideration mainly of efficiency or at a temperature of 150° C. or lower in consideration mainly of thermal vulnerability.

As described above, at the wavelength of about 550 nm, the sixth capping layer 346 may have a refractive index of about 1.4 to about 1.7, and the filler material 70 may have a refractive index of about 1.4 to about 1.6. The refractive index of the sixth capping layer 346 may be greater than, less than, or substantially the same as, the refractive index of the filler material 70. Even if the refractive index of the sixth capping layer 346 differs from the refractive index of the filler material 70, the difference between the refractive index of the sixth capping layer 346 and the refractive index of the filler material 70 may be less than or equal to about 0.2. In this case, any changes in the path of light at the interface between the filler material 70 and the sixth capping layer 346 can be reduced.

The thickness of the sixth capping layer 346 may be about 100 Å to about 1200 Å. The thickness of the sixth capping layer 346 is related with (e.g., chosen based on) lyophilicity and light transmittance. For example, when the thickness of the sixth capping layer 346 is greater than about 200 Å, the sixth capping layer 346 may have a stable lyophilicity with (e.g., affinity to) the filler material 70. That is, the effective thickness of the sixth capping layer 346 that can ensure lyophilicity with the filler material 70 may be about 200 Å. Also, when the thickness of the sixth capping layer 346 is about 1000 Å or less, the light transmittance of the sixth capping layer 346 may be about 80% or higher. That is, the thickness of the sixth capping layer 346 that can ensure a light transmittance of at least about 80% or higher may be about 1000 Å or less. The thickness of the sixth capping layer 346 may, for example, preferably be about 200 Å to about 1000 Å in terms of both lyophilicity and light transmittance.

Referring to FIG. 9, molecules of $AO_XN_Y$ at the interface between the sixth capping layer 346 and the filler material 70 may have first material binding forces FS therebetween. Molecules of the material of the filler material 70 at the interface between the sixth capping layer 346 and the filler material 70 may have second material binding forces FL therebetween. The $AO_XN_Y$ at the interface between the sixth capping layer 346 and the filler material 70 may have a first interfacial tension F1, which is the sum of the first material binding forces FS, and the material of the filler material 70 at the interface between the sixth capping layer 346 and the filler material 70 may have a second interfacial tension F2, which is the sum of the second material binding forces FL.

The first interfacial tension F1 may be greater than the second interfacial tension F2. That is, at the interface between the sixth capping layer 346 and the filler material 70, the sixth capping layer 346 may have a greater surface tension than the filler material 70. For example, the interfacial tension F1 of the sixth capping layer 346 may be about 60 mN/m or greater. The first surface tension F1 may include a polarity tension (e.g., a polar component) and a non-polarity tension (e.g., a non-polar component). The polarity tension may be a tension that occurs due to the polarity caused by the polar part of the $AO_XN_Y$, i.e., the oxygen atom(s). The nonpolar tension may be a tension caused by the nitrogen atom(s) having a relatively lower electronegativity (of about 3.0) than the oxygen atom(s) (having an electronegativity of about 3.5). In one embodiment, the polarity tension may be about 35 mN/m or greater, and the non-polar tension may be about 30 mN/m or greater. The sum of the polarity tension and the non-polarity tension may be equal to the first interfacial tension F1. As the first content X of the sixth capping layer 346, i.e., the oxygen content of the sixth capping layer 346, increases, the polarity of the $AO_XN_Y$ that forms the sixth capping layer 346 may increase, and as a result, the first interfacial tension F1 may generally increase. The degree to which the first interfacial tension F1 increases in accordance with the first content X of the sixth capping layer 346 may be greater than the degree to which the first interfacial tension F1 increases in accordance with the second content Y of the sixth capping layer 346, i.e., the nitrogen content of the sixth capping layer 346.

When the interfacial tension F1 of the sixth capping layer 346 is greater than the interfacial tension F2 of the filler material 70, the interfacial energy of the sixth capping layer 346 may be greater than the interfacial energy of the filler material 70. The greater the interfacial energy of the sixth capping layer 346, the more the $AO_XN_Y$ at the interface between the sixth capping layer 346 and the filler material 70 tends to bond with the filler material 70. Specifically, because the interfacial energy of the sixth capping layer 346 is greater than the interfacial energy of the filler material 70, the $AO_XN_Y$ at the interface between the sixth capping layer 346 and the filler material 70 has a tendency to bond with the material of the filler material 70 and thus to lower the interfacial energy. As a result, the $AO_XN_Y$ at the surface of the sixth capping layer 346 can easily bond with the filler material 70.

In this case, the bonding force between the sixth capping layer 346 and the filler material 70 may be a first interfacial bonding force FSL1. The first interfacial bonding force FSL1 has a correlation with the difference between the first interfacial force F1 and the second interfacial force F2. For example, as the difference between the first interfacial force F1 and the second interfacial force F2 increases, the first interfacial bonding force FSL1 may increase.

As described above, as the first content X of the sixth capping layer 346 increases, the polarity of the $AO_XN_Y$ that forms the sixth capping layer 346 may increase, and the first interfacial tension F1 may also increase. As a result, the first interfacial bonding force FSL1 between the sixth capping layer 346 and the filler material 70 may increase. Accordingly, the adhesion of the filler material 70 to the surface of the sixth capping layer 346 or the wetting of the filler material 70 can be improved, and the filler material 70 can be properly adhered to the light converter 300. Therefore, the filler material 70 can properly fill recesses on the surface of the light converter 300 and can thus substantially planarize the surface of the light converter 300. Once the surface of the light converter 300 is planarized, the risk of forming scratches can be reduced, and the durability of the display device 1 can be improved. That is, the surface planarization function of the light converter 300 and the durability of the display device 1 can both be improved without considerably (e.g., significantly) increasing the thickness of the filler material 70 to fill recesses on the surface of the light converter 300.

The second content Y of the $AO_XN_Y$ of the sixth capping layer 346 is greater than 0 and less than 1. Thus, if at least some nitrogen atoms are included in the sixth capping layer 346, the function of protecting the inside of the display device 1 against external moisture or air can be strengthened.

Display devices according to other embodiments of the present disclosure will hereinafter be described. In FIGS. 1 through 24, like reference numerals indicate like elements, and thus, detailed descriptions thereof will not be repeated.

Figure 10:
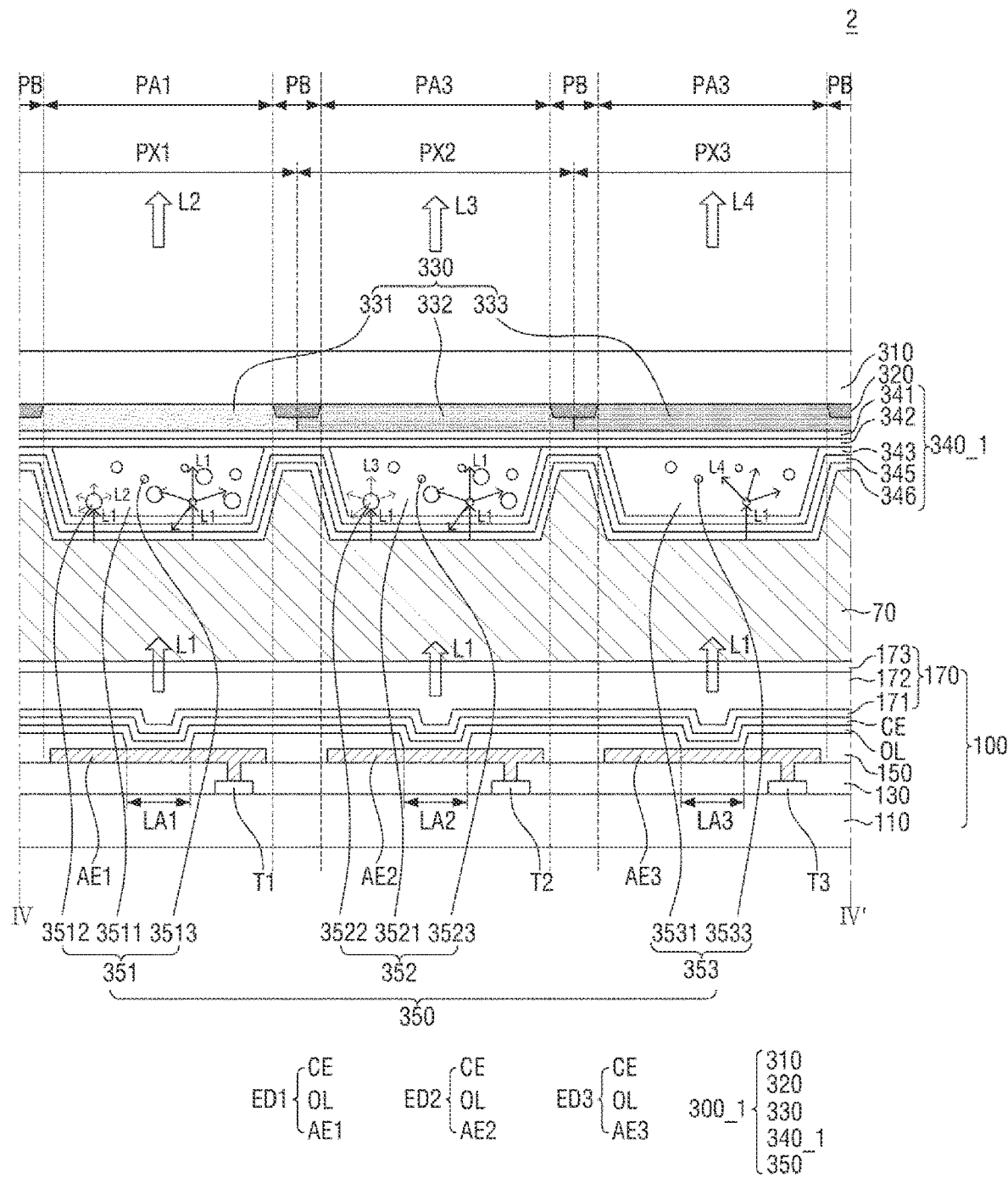
FIG. 10 is a cross-sectional view of a display device according to another embodiment of the present disclosure.
Figure 11:
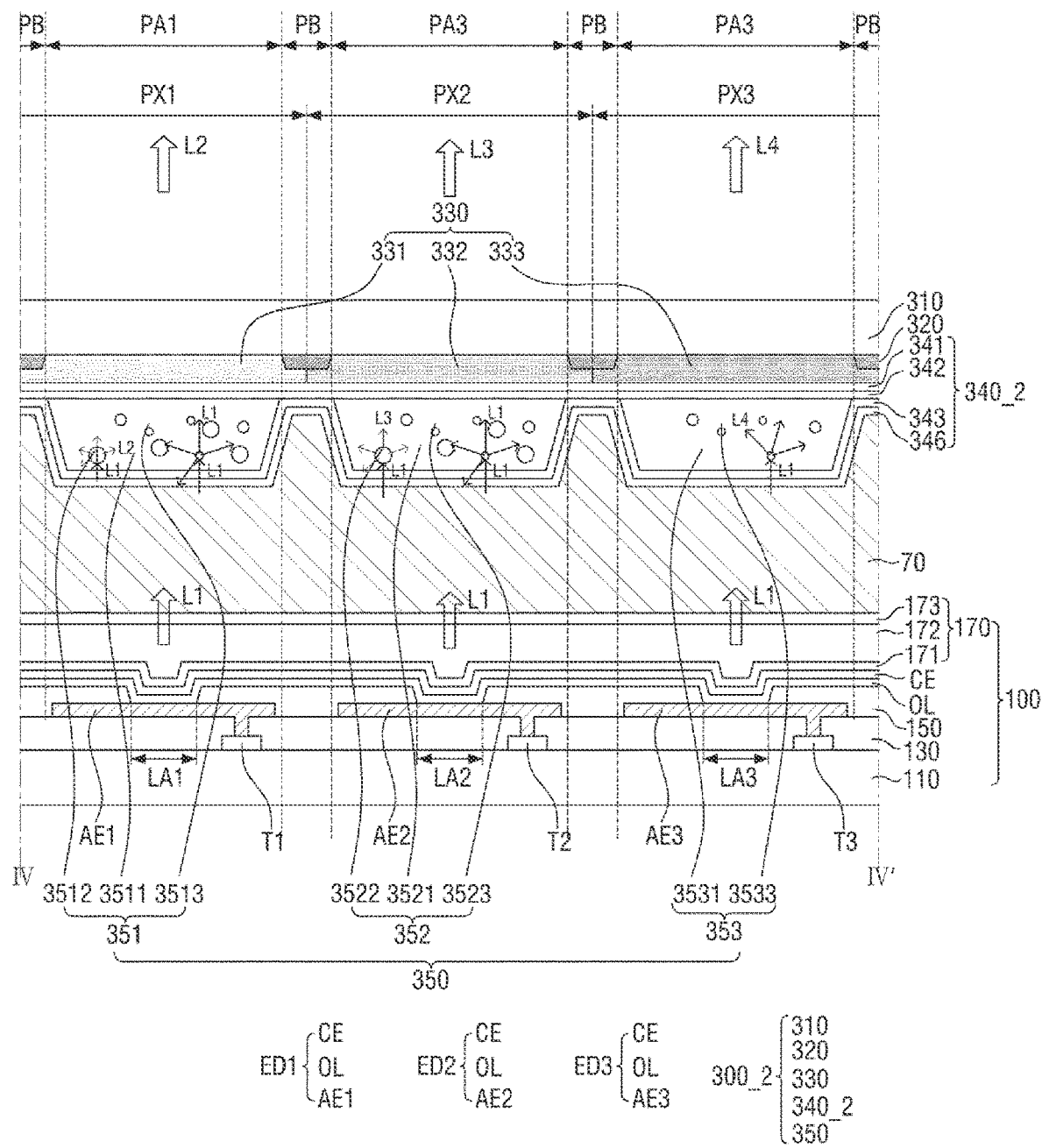
FIGS. 11 through 19 are cross-sectional views of display devices according to other embodiments of the present disclosure.

FIG. 10 is a cross-sectional view of a display device according to another embodiment of the present disclosure, and FIG. 11 is a cross-sectional view of a display device according to another embodiment of the present disclosure.

FIGS. 10 and 11 illustrate examples in which at least one capping layer may not be included (e.g., repeated) from between light conversion patterns 350 and a sixth capping layer 346. Referring to FIG. 10, a display device 2 of FIG. 10 differs from the display device 1 in that an interlayer organic layer 344 (or a fourth capping layer) is not provided. That is, referring to FIG. 10, a fifth capping layer 345 may be disposed on a third capping layer 343. The fourth capping layer, which is a planarization layer including an organic material, may alleviate height differences on a light converter 300_1 by filling recesses on the light converter 300_1. However, when the sixth capping layer 346 is applied, the recesses on the light converter 300_1 may not need to be filled with the fourth capping layer. The sixth capping layer 346 is disposed at the outermost part of the light converter 300_1. The sixth capping layer 346 includes a non-metal or metal compound having a greater first content X (i.e., a greater oxygen content) than a second content Y (i.e., a nitrogen content) thereof and may thus have a strong interfacial bonding force with respect to a filler material 70. Accordingly, in the embodiment of FIG. 10, the height differences on the light converter 300_1 can be alleviated simply utilizing the filler material 70 without the aid of the fourth capping layer. Also, because the fourth capping layer including an organic material is not provided, the general (e.g., total) thickness of the display device 2 can be reduced.

Referring to FIG. 11, a display device 3 differs from the display device 2 of FIG. 10 in that a fifth capping layer 345 is not provided. Referring to FIG. 11, the fifth capping layer 345 may protect a light converter 300_2 against external air or moisture that may penetrate the light converter 300_2 from below the light converter 300_2. A sixth capping layer 346 may include nitrogen atoms. That is, when a second content Y of $AO_XN_Y$ that forms the sixth capping layer 346 is at least greater than 0 and less than 1, the protective film function of the sixth capping layer 346 can be improved, and as a result, the sixth capping layer 346 can properly protect the light converter 300_2 without the aid of the fifth capping layer 345.

A third capping layer 343 may include silicon nitride. In the embodiment of FIG. 11, the sixth capping layer 346 may be formed directly on the third capping layer 343. As described above, the sixth capping layer 346 may include nitrogen atoms. That is, the second content Y of the $AO_XN_Y$ of the sixth capping layer 346 may be at least greater than 0 and less than 1. In this case, even if the sixth capping layer 346 is formed directly on the third capping layer 343, any changes in optical characteristics that may be caused by material variations in films or layers that are stacked in a thickness direction can be minimized or reduced because the material of the sixth capping layer 346 contains nitrogen.

FIGS. 12 through 18 are cross-sectional views of display devices according to other embodiments of the present disclosure. FIGS. 12 through 18 illustrate various modified examples of the light-shielding member 320.

Figure 12:
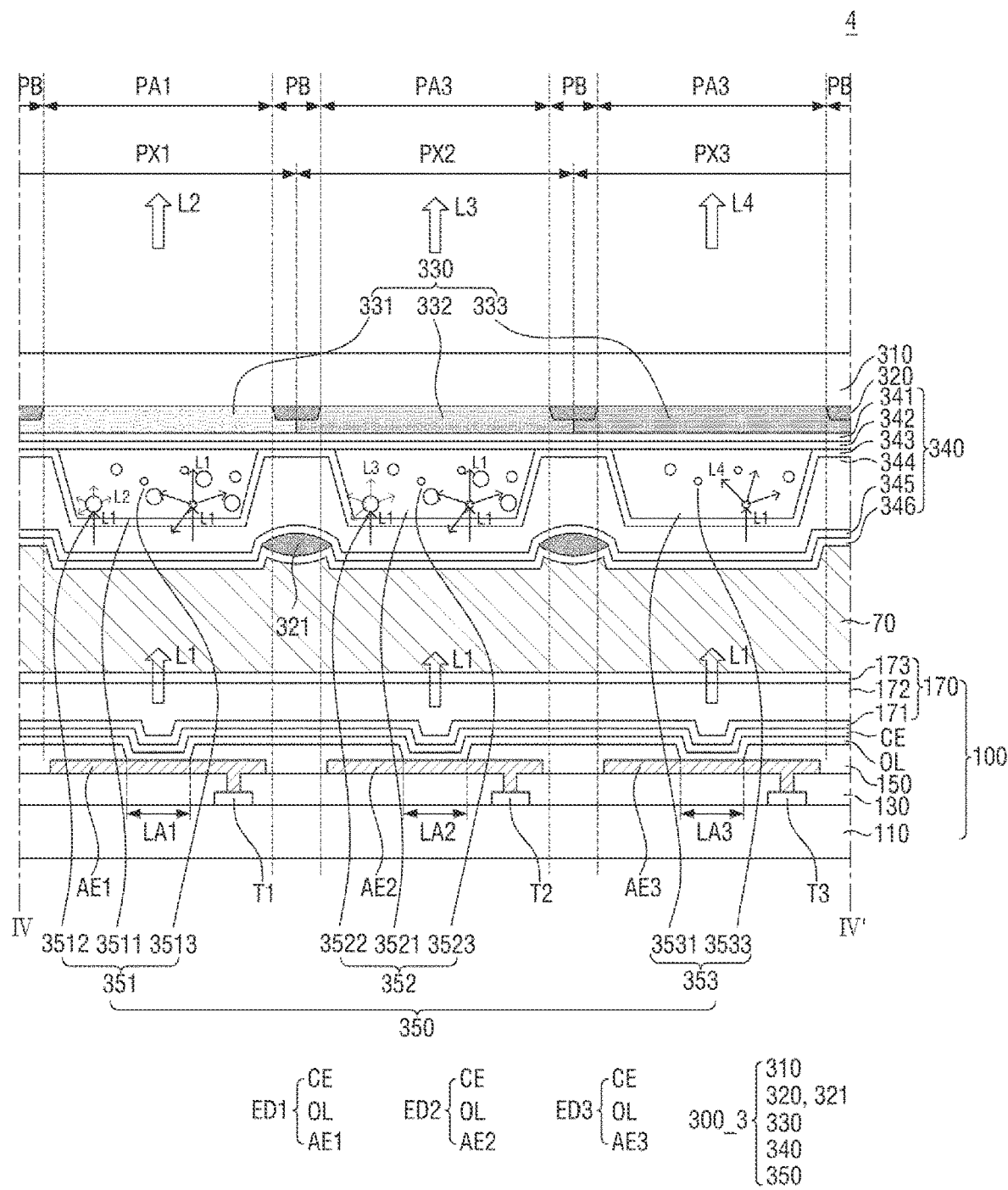

Referring to FIG. 12, a light converter 300_3 differs from the light converter 300 of FIG. 4 in that it further includes a second light-shielding member 321 on a sixth capping layer 346.

Specifically, the second light-shielding member 321 may be disposed between a fifth capping layer 345 and the sixth capping layer 346. The second light-shielding member 321 may be disposed to overlap with non-light output areas PB. The second light-shielding member 321, like (e.g., similar to) the light-shielding member 320, may be disposed between first, second, and third light output areas PA1, PA2, and PA3 to prevent or substantially prevent the mixing of light emitted from the first, second, and third light output areas PA1, PA2, and PA3. The second light-shielding member 321 may be formed of substantially the same material as the light-shielding member 320. The second light-shielding member 321 may be in direct contact with one surface of the sixth capping layer 346. As described above, in the non-light output areas PB, recesses may be formed in a direction away from a light provider 100. When blue light L1 emitted from the light provider 100 passes through the recesses, the recesses may become optical interfaces, in which case, the color purity of the blue light L1 may be lowered because of unexpected light conversions such as refractions at the optical interfaces. However, in the embodiment of FIG. 12, the second light-shielding member 321 is disposed to overlap with the non-light output areas PB. Thus, even if unexpected light conversions such as refractions occur at the optical interfaces, the propagation of light resulting from the light conversions can be blocked, and as a result, the color purity of the blue light L1 can be prevented or substantially prevented from being lowered.

Also, the second light-shielding member 321 may be disposed to overlap with concave parts of the fifth capping layer 345 to planarize recesses formed in the non-light output areas PB of the light converter 300_3.

In the embodiment of FIG. 12, as a first content X of the sixth capping layer 346 increases, the polarity of $AO_XN_Y$ that forms the sixth capping layer 346 may increase, and a first interfacial tension F1 may also increase. As a result, a first interfacial bonding force FSL1 between the sixth capping layer 346 and the filler material 70 may increase. Accordingly, the adhesion of the filler material 70 to the surface of the sixth capping layer 346 or the wetting of the filler material 70 can be improved, and the filler material 70 can be properly adhered to the light converter 300_3. Therefore, the filler material 70 can properly fill recesses on the surface of the light converter 300_3 and can thus substantially planarize the surface of the light converter 300_3. Once the surface of the light converter 300_3 is planarized, the risk of forming scratches can be reduced, and the durability of a display device 4 can be improved. That is, the surface planarization function of the light converter 300_3 and the durability of the display device 4 can both be improved without considerably (e.g., significantly) increasing the thickness of the filler material 70 to fill recesses on the surface of the light converter 300_3.

Figure 13:
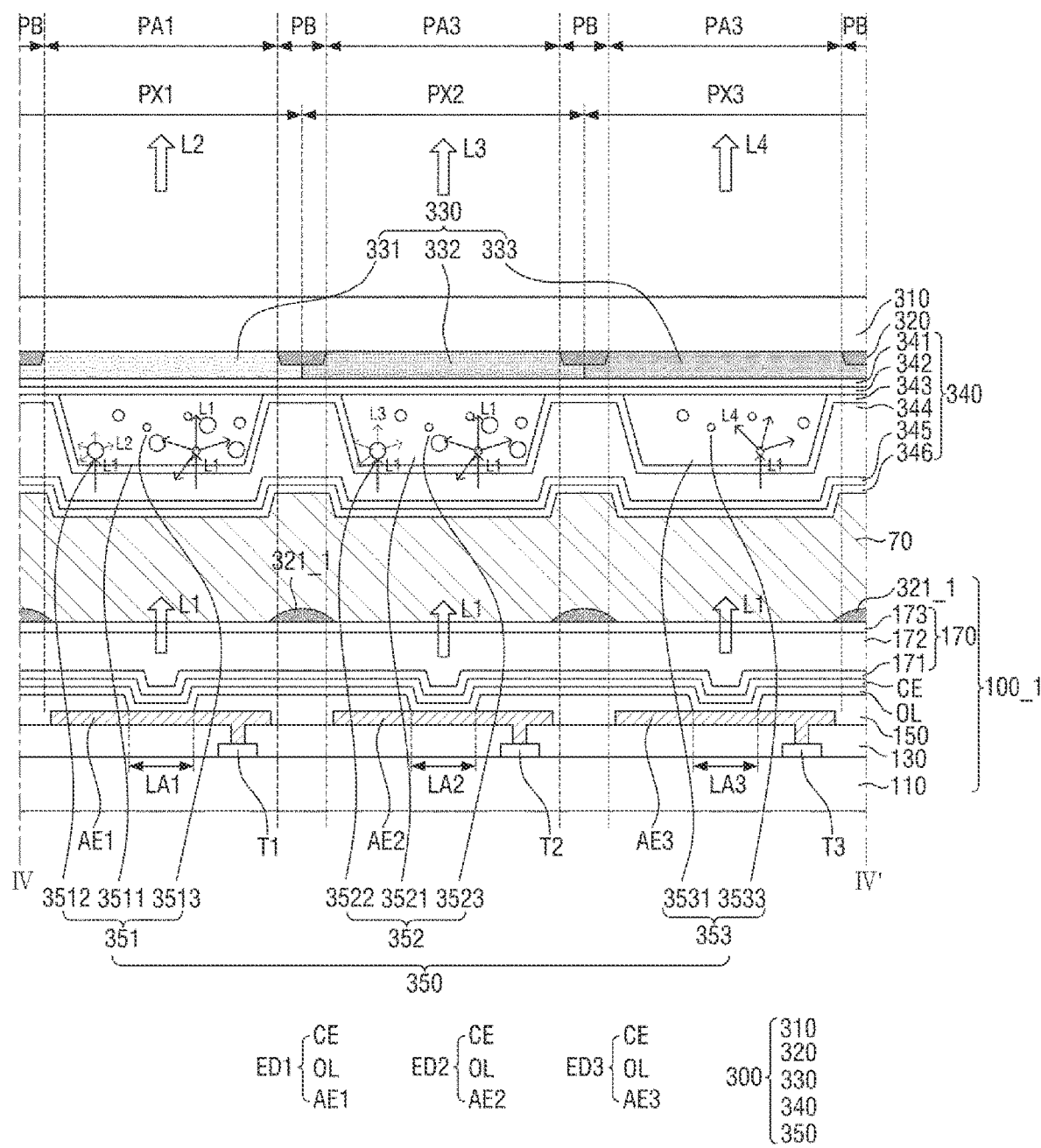

Referring to FIG. 13, a second light-shielding member 321_1 differs from the second light-shielding member 321 of FIG. 12 in that it is disposed in a light provider 100_1.

Specifically, the second light-shielding member 321_1 may be disposed on a second encapsulation inorganic film 173. A filler material 70 may be disposed on the second light-shielding member 321_1. The second light-shielding member 321_1 may be disposed between the second encapsulation inorganic film 173 and the filler material 70.

In the embodiment of FIG. 13, in non-light output areas PB, recesses may be formed in a direction away from the light provider 100_1. When blue light L1 emitted from the light provider 100_1 passes through the recesses, the recesses may become optical interfaces, in which case, the color purity of the blue light L1 may be lowered because of unexpected light conversions such as refractions at the optical interfaces. However, in the embodiment of FIG. 13, the second light-shielding member 321_1 is disposed to overlap with the non-light output areas PB. Thus, even if unexpected light conversions such as refractions occur at the optical interfaces, the propagation of light resulting from the light conversions can be blocked, and as a result, the color purity of the blue light L1 can be prevented or substantially prevented from being lowered.

Also, the second light-shielding member 321_1 may be disposed to overlap with concave parts of a fifth capping layer 345 to planarize recesses formed in the non-light output areas PB of a light converter 300.

In the embodiment of FIG. 13, as a first content X of a sixth capping layer 346 increases, the polarity of $AO_XN_Y$ that forms the sixth capping layer 346 may increase, and a first interfacial tension F1 may also increase. As a result, a first interfacial bonding force FSL1 between the sixth capping layer 346 and the filler material 70 may increase. Accordingly, the adhesion of the filler material 70 to the surface of the sixth capping layer 346 or the wetting of the filler material 70 can be improved, and the filler material 70 can be properly adhered to the light converter 300. Therefore, the filler material 70 can properly fill recesses on the surface of the light converter 300 and can thus substantially planarize the surface of the light converter 300. Once the surface of the light converter 300 is planarized, the risk of forming scratches can be reduced, and the durability of a display device 5 can be improved. That is, the surface planarization function of the light converter 300 and the durability of the display device 5 can both be improved without considerably (e.g., significantly) increasing the thickness of the filler material 70 to fill recesses on the surface of the light converter 300.

Figure 14:
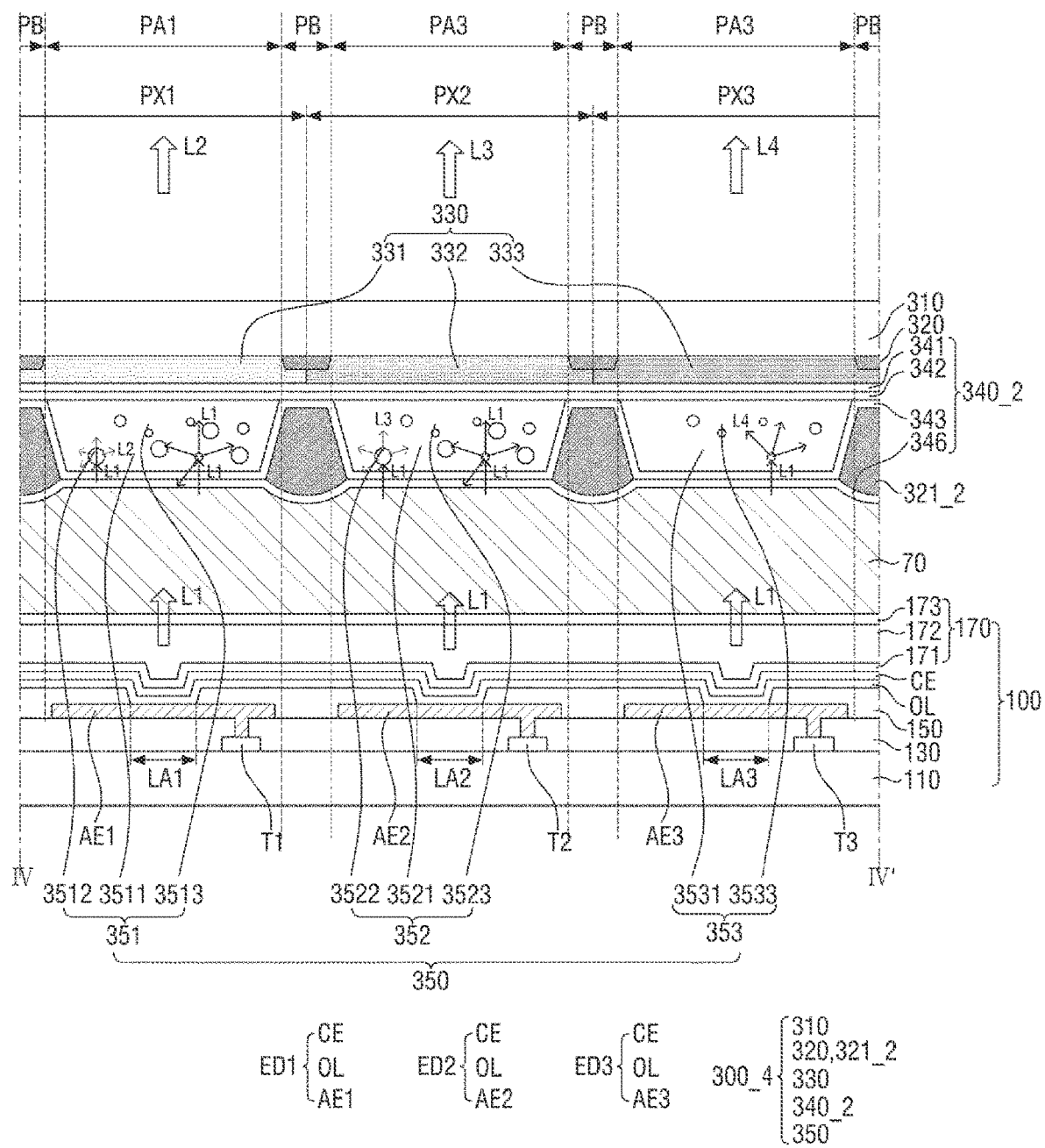

Referring to FIG. 14, a light converter 300_4 differs from the light converter 300_2 of FIG. 11 in that a second light-shielding member 321_2 is disposed between third and sixth capping layers 343 and 346 of a light converter 300_4.

The second light-shielding member 321_2 may include substantially the same material as the second light-shielding member 321_1 of FIG. 13.

The second light-shielding member 321_2 may be in direct contact with the third and sixth capping layers 343 and 346.

In the embodiment of FIG. 14, in non-light output areas PB, recesses may be formed in a direction away from a light provider 100. When blue light L1 emitted from the light provider 100 passes through the recesses, the recesses may become optical interfaces, in which case, the color purity of the blue light L1 may be lowered because of unexpected light conversions such as refractions at the optical interfaces. However, in the embodiment of FIG. 14, the second light-shielding member 321_2 is disposed to overlap with the non-light output areas PB. Thus, even if unexpected light conversions such as refractions occur at the optical interfaces, the propagation of light resulting from the light conversions can be blocked, and as a result, the color purity of the blue light L1 can be prevented or substantially prevented from being lowered.

Also, the second light-shielding member 321_2 may be disposed to overlap with concave parts of the third capping layer 343 to planarize recesses formed in the non-light output areas PB of the light converter 300_4.

In the embodiment of FIG. 14, as a first content X of the sixth capping layer 346 increases, the polarity of $AO_XN_Y$ that forms the sixth capping layer 346 may increase, and a first interfacial tension F1 may also increase. As a result, a first interfacial bonding force FSL1 between the sixth capping layer 346 and a filler material 70 may increase. Accordingly, the adhesion of the filler material 70 to the surface of the sixth capping layer 346 or the wetting of the filler material 70 can be improved, and the filler material 70 can be properly adhered to the light converter 300_4. Therefore, the filler material 70 can properly fill recesses on the surface of the light converter 300_4 and can thus substantially planarize the surface of the light converter 300_4. Once the surface of the light converter 300_4 is planarized, the risk of forming scratches can be reduced, and the durability of a display device 6 can be improved. That is, the surface planarization function of the light converter 300_4 and the durability of the display device 6 can both be improved without considerably (e.g., significantly) increasing the thickness of the filler material 70 to fill recesses on the surface of the light converter 300_4.

Figure 15:
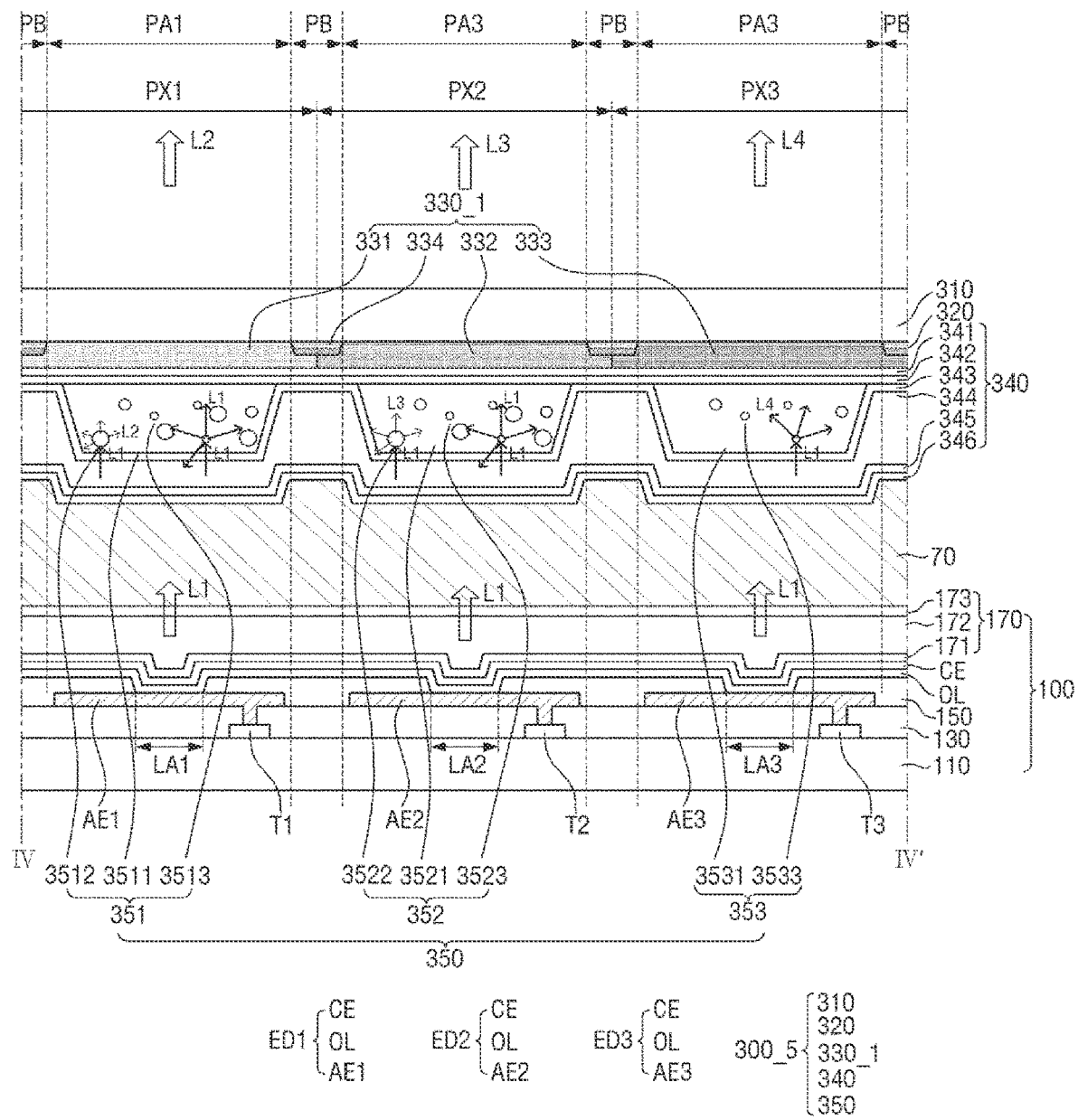

Referring to FIG. 15, a light converter 300_5 differs from the light converter 300 of FIG. 13 in that it further includes a reflective filter 334 disposed on a second base substrate 310. Specifically, the reflective filter 334 may be disposed on the second base substrate 310. The reflective filter 334 may overlap with a light-shielding member 320 in a thickness direction. The reflective filter 334 may be disposed in non-light output areas PB. The light-shielding member 320 may be disposed on the reflective filter 334.

The reflective filter 334 may transmit blue light therethrough and may reflect other light.

Specifically, external light incident upon a non-display area NA of a display device 7 may pass through the reflective filter 334, which is disposed between the second base substrate 310 and the light-shielding member 320. That is, the external light passing through the reflective filter 334 may be blue light and may be emitted out of the display device 7 by being reflected at the interface between the light-shielding member 320 and the reflective filter 334. The embodiment of FIG. 15 may be employed when the aperture ratio of a third color filter 333 is smaller than the aperture ratios of first and second color filters 331 and 332. In response to external light being incident upon the display surface of the display device 7, the external light may be converted by the light converter 300_5 or a metal material disposed in layers below the light converter 300_5 and may then be emitted out of the display device 7. In this case, the amount of blue light passing through the third color filter 333 may be less than the amounts of red light L2 and green light L3 emitted through the first and second color filters 331 and 332. Because different amounts of light are emitted on a wavelength-by-wavelength basis due to the reflection of external light, the general color purity of the display device 7 may be degraded. However, in the embodiment of FIG. 15, such color purity degradation can be addressed because the reflective filter 334 is utilized.

In one embodiment, the light-shielding member 320 may include an organic material and may be formed of a material having a different refractive index from the reflective filter 334. When the light-shielding member 320 and the reflective filter 334 have different refractive indexes, some light may be reflected at the interface between the light-shielding member 320 and the reflective filter 334 because of the difference in refractive index between the light-shielding member 320 and the reflective filter 334.

In some embodiments, the light-shielding member 320 may be formed of a metal material. When the light-shielding member 320 includes a metal material, external light can be reflected by the metal material at the interface between the light-shielding member 320 and the reflective filter 334.

The material of the light-shielding member 320 is not particularly limited as long as it is capable of reflecting, from above the reflective filter 334, external light passing through the reflective filter 334.

In the embodiment of FIG. 15, as a first content X of a sixth capping layer 346 increases, the polarity of $AO_XN_Y$ that forms the sixth capping layer 346 may increase, and a first interfacial tension F1 may also increase. As a result, a first interfacial bonding force FSL1 between the sixth capping layer 346 and a filler material 70 may increase. Accordingly, the adhesion of the filler material 70 to the surface of the sixth capping layer 346 or the wetting of the filler material 70 can be improved, and the filler material 70 can be properly adhered to the light converter 300_5. Therefore, the filler material 70 can properly fill recesses on the surface of the light converter 300_5 and can thus substantially planarize the surface of the light converter 300_5. Once the surface of the light converter 300_5 is planarized, the risk of forming scratches can be reduced, and the durability of the display device 7 can be improved. That is, the surface planarization function of the light converter 300_5 and the durability of the display device 7 can both be improved without considerably (e.g., significantly) increasing the thickness of the filler material 70 to fill recesses on the surface of the light converter 300_5.

Figure 16:
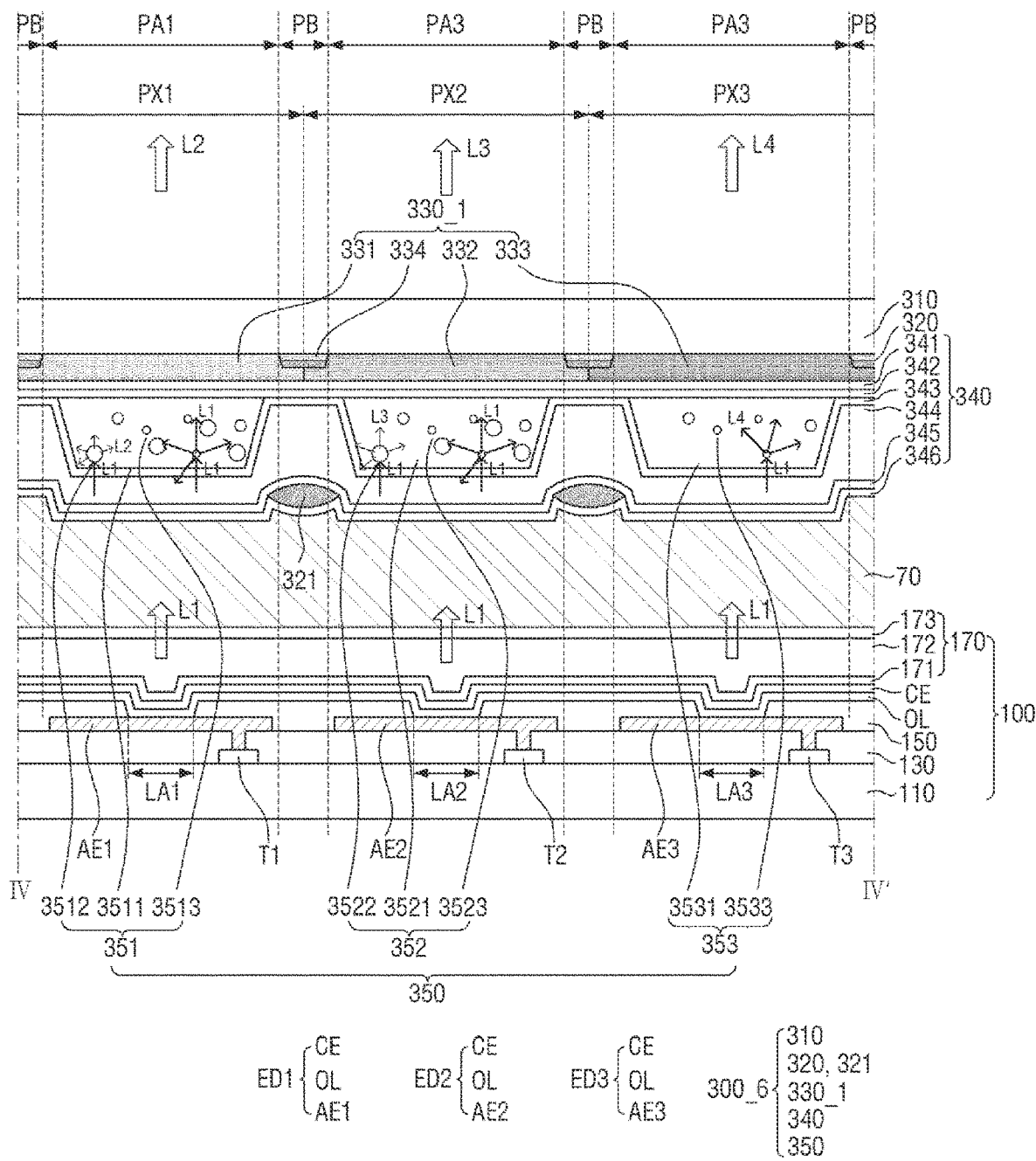

Referring to FIG. 16, a light converter 300_6 differs from the light converter 300_3 of FIG. 12 in that it further includes a reflective filter 334. The reflective filter 334 and a second light-shielding member 321 of the light converter 300_6 are as already described above, and thus, detailed descriptions thereof will not be repeated.

Figure 17:
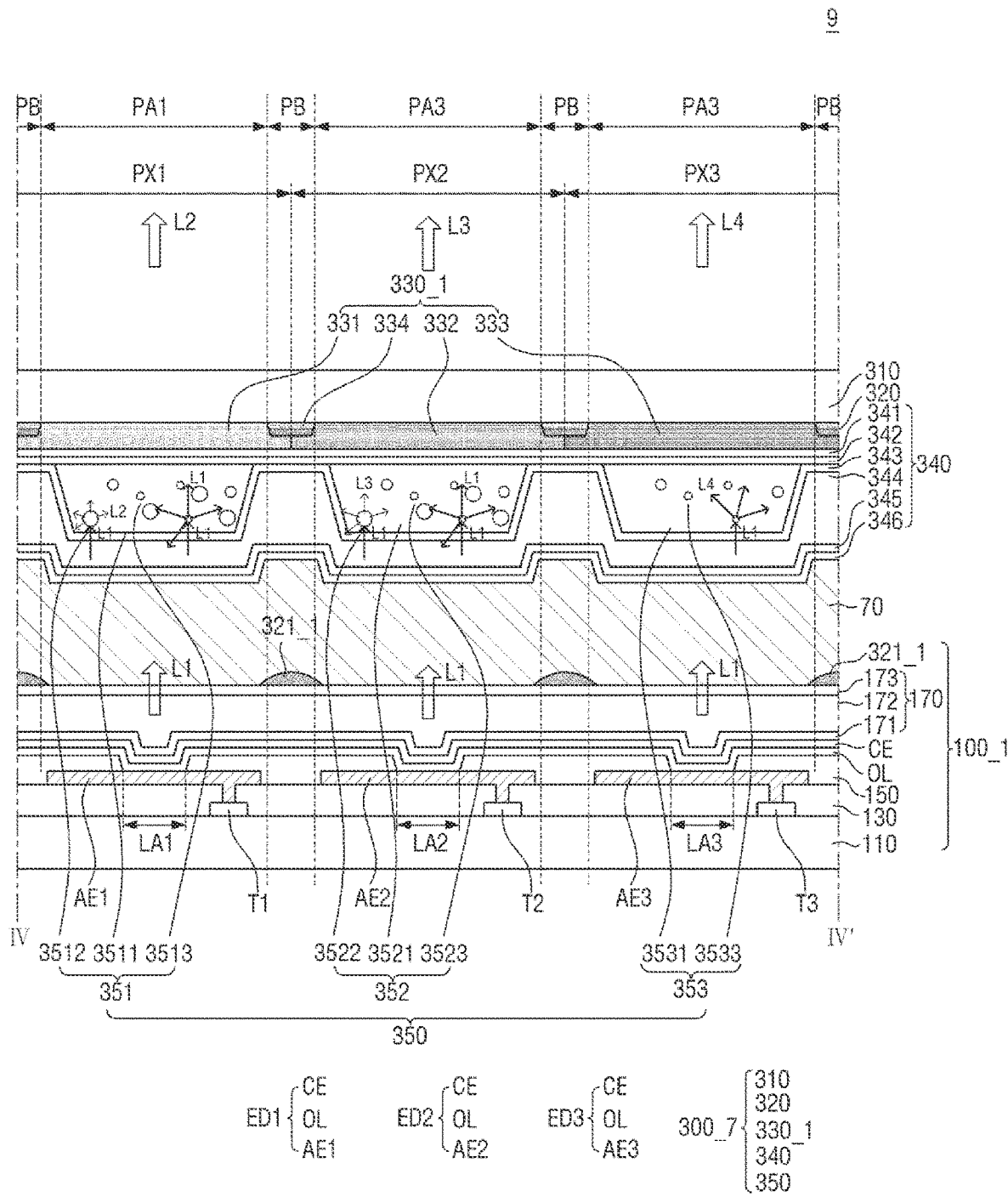

Referring to FIG. 17, a light converter 300_7 differs from the light converter 300 of FIG. 13 in that it further includes a reflective filter 334. The reflective filter 334 and a second light-shielding member 321_1 of the light converter 300_7 are as already described above, and thus, detailed descriptions thereof will not be repeated.

Figure 18:
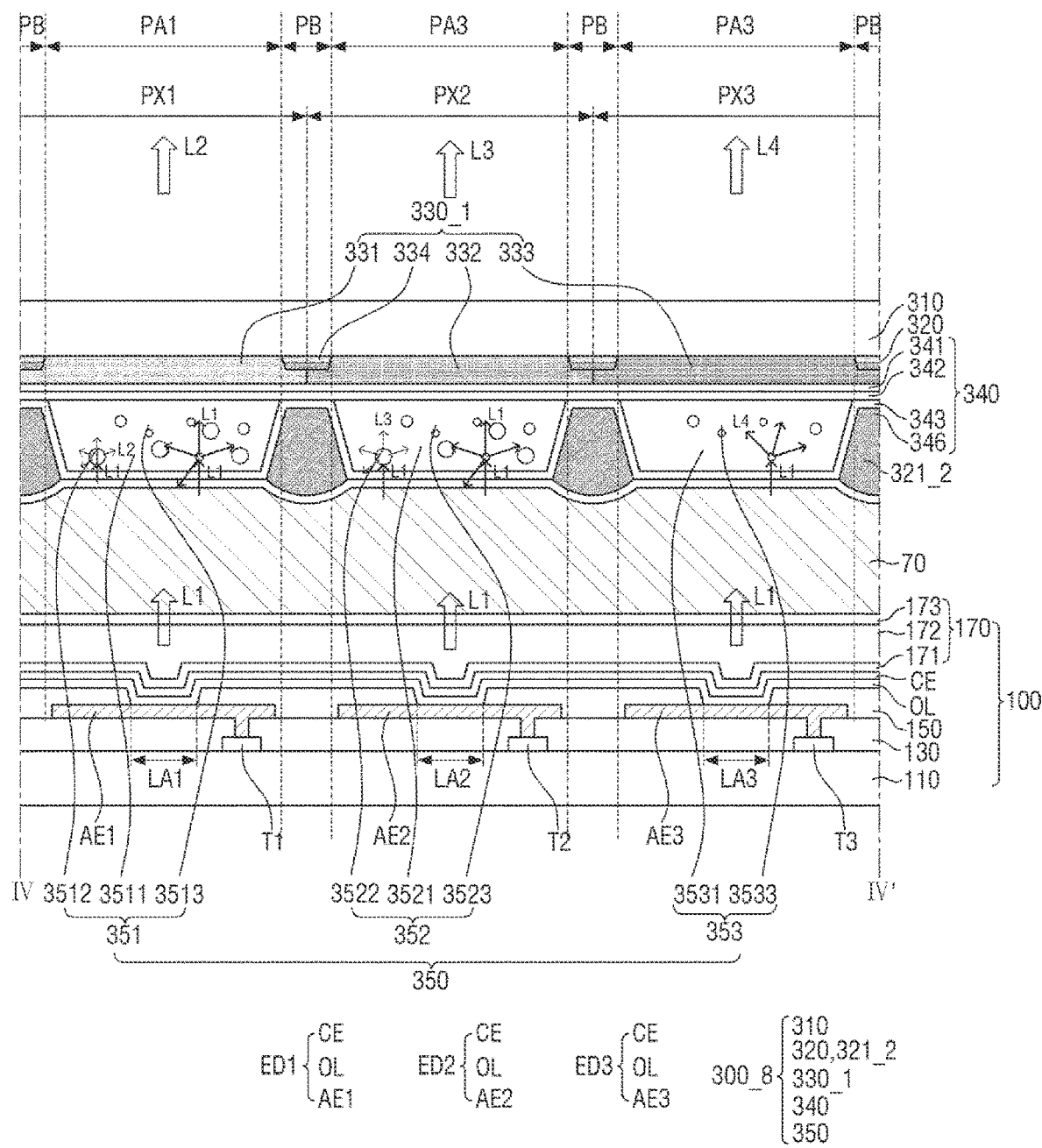

Referring to FIG. 18, a light converter 300_8 differs from the light converter 300_4 of FIG. 14 in that it further includes a reflective filter 334. The reflective filter 334 and a second light-shielding member 321_2 of the light converter 300_8 are as already described above, and thus, detailed descriptions thereof will not be repeated.

Figure 19:
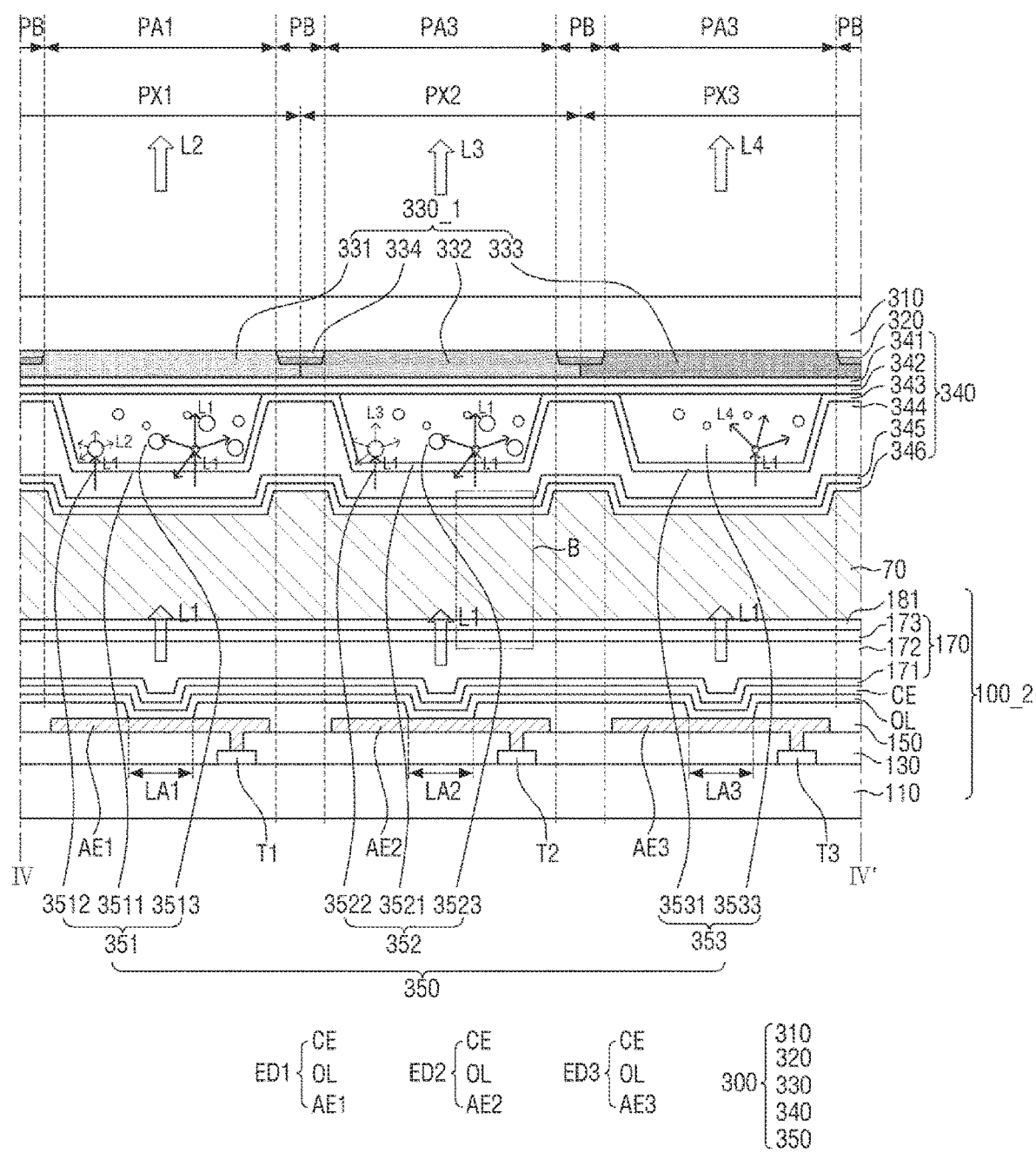
Figure 20:
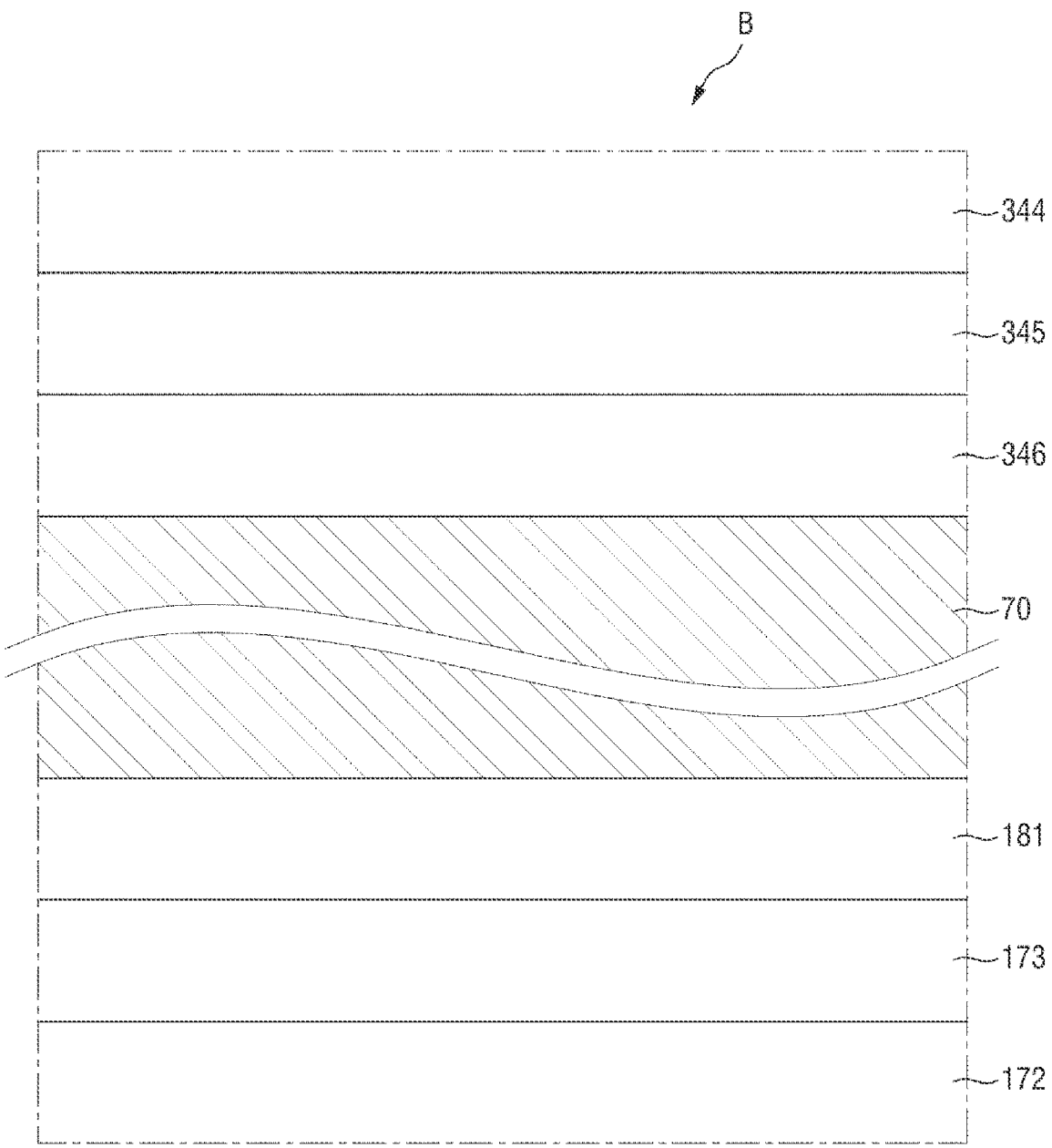
FIG. 20 is a cross-sectional view illustrating an area B of FIG. 19.
Figure 21:
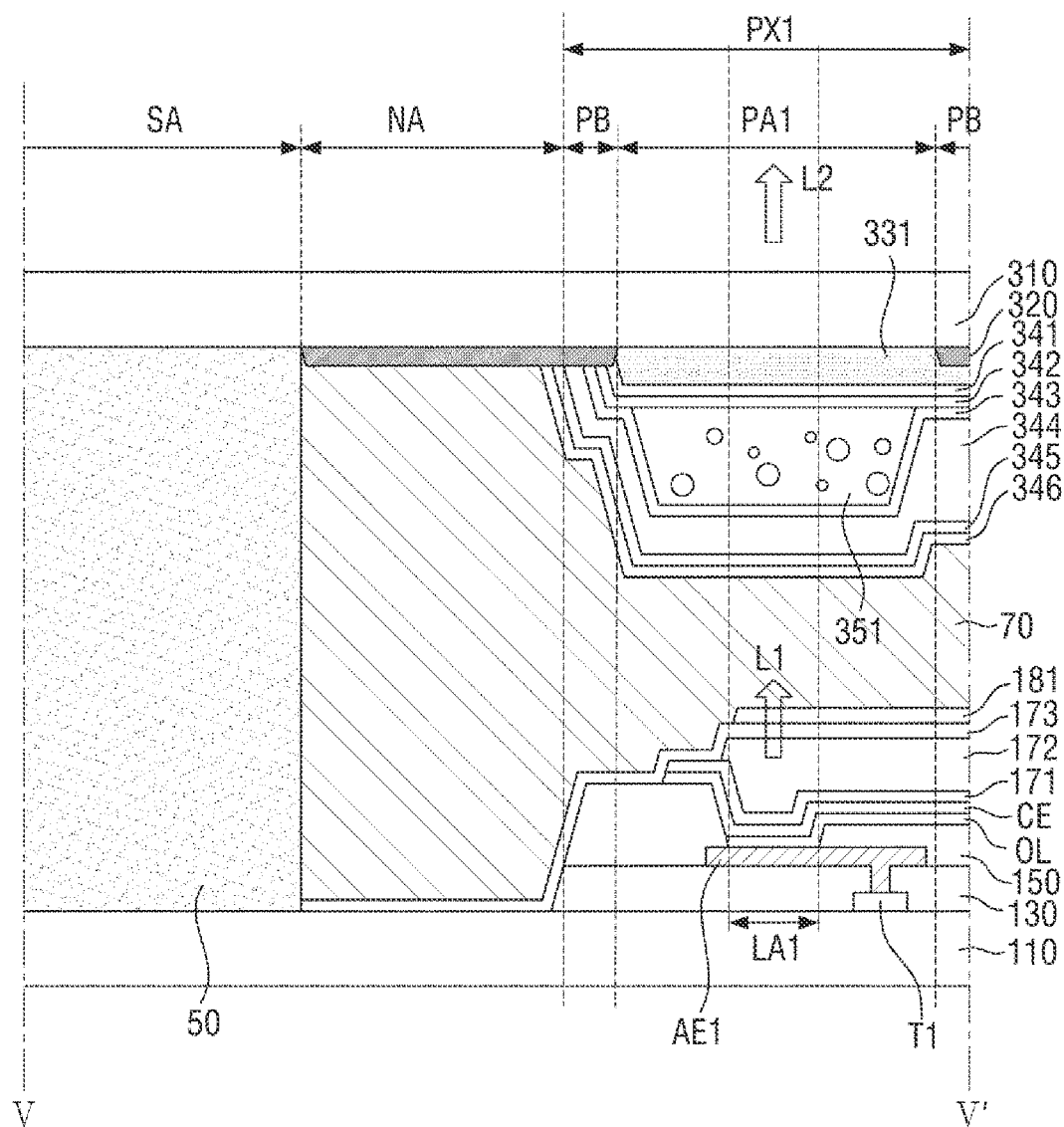
FIGS. 21 through 24 are cross-sectional views of display devices according to other embodiments of the present disclosure.
Figure 22:
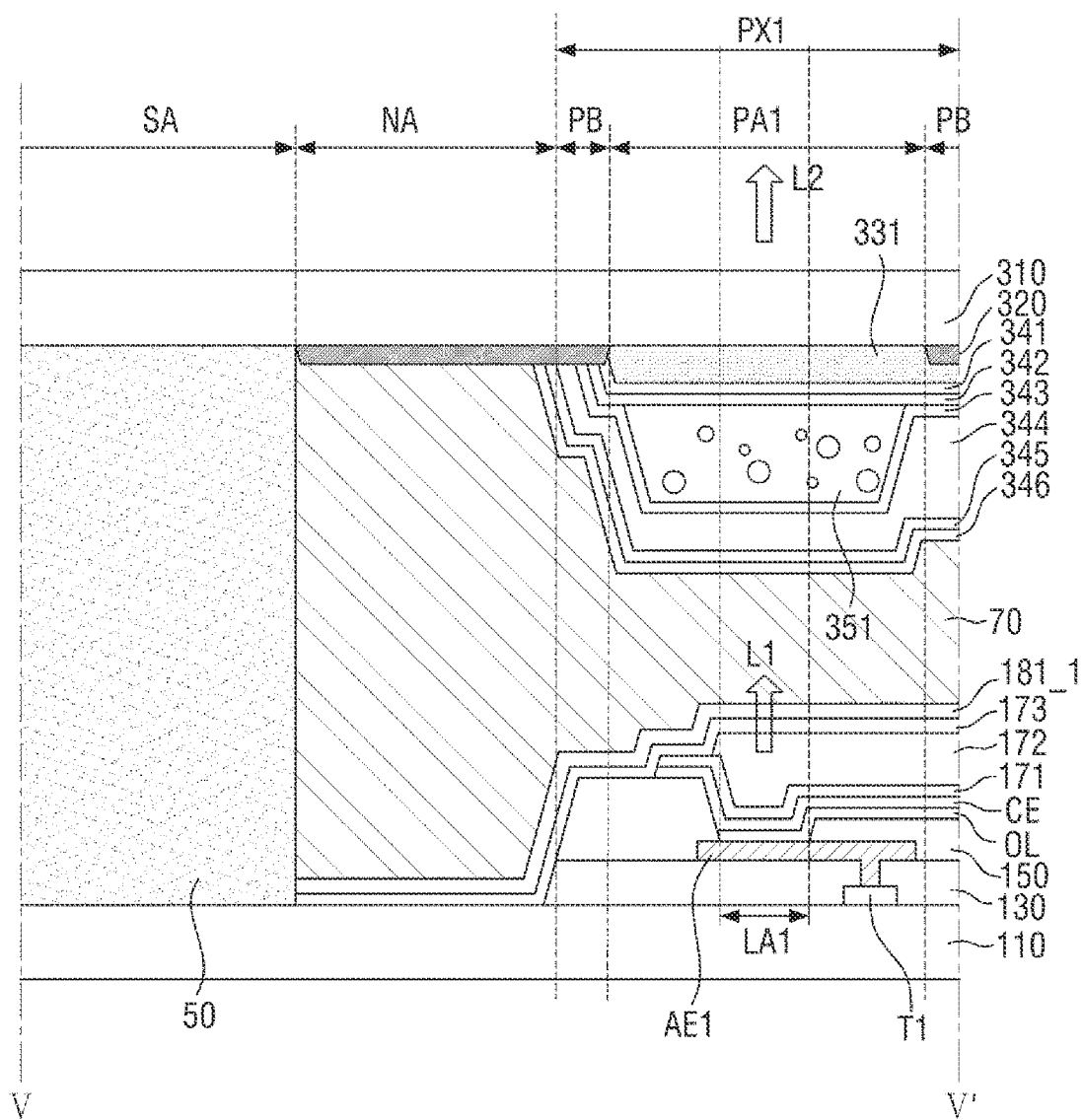

FIG. 19 is a cross-sectional view of a display device according to another embodiment of the present disclosure, FIG. 20 is an enlarged cross-sectional view illustrating an area B of FIG. 19, and FIG. 21 is a cross-sectional view of the display device according to the embodiment of FIG. 19. FIG. 22 is a cross-sectional view of a modified example of the display device according to the embodiment of FIG. 19.

Referring to FIGS. 19 through 22, a light provider 100_2 of a display device 11 differs from the light provider 100 of the display device 1 in that it further includes a second outermost layer 181 or 181_1.

Specifically, the light provider 100_2 may include the second outermost layer 181 disposed between a thin-film encapsulation layer 170 and a filler material 70. The second outermost layer 181 may be disposed on a second encapsulation inorganic film 173 of the thin-film encapsulation layer 170 and may be in direct contact with the filler material 70. The second outermost layer 181 may be formed of substantially the same material as the sixth capping layer 346 described above with reference to FIGS. 8 and 9. The second outermost layer 181 is substantially the same as described above with regard to the sixth capping layer 346, and thus, a detailed description thereof will not be repeated. Referring to FIG. 22, the second outermost layer 181_1 may be disposed to extend even into a non-display area NA between a sealing area SA and non-light output areas PB. Specifically, the second outermost layer 181_1 may cover the top surface and the side surfaces of a second encapsulation inorganic film 173 and may also cover the top surface of a first base substrate 110. The second outermost layer 181_1 may be in direct contact with the top surface and the side surfaces of the second inorganic encapsulation film 173 and with the top surface of the first base substrate 110.

In the embodiment of FIGS. 19 through 21, as a first content X of a sixth capping layer 346 increases, the polarity of $AO_XN_Y$ that forms the sixth capping layer 346 may increase, and a first interfacial tension F1 may also increase. As a result, a first interfacial bonding force FSL1 between the sixth capping layer 346 and the filler material 70 may increase. Accordingly, the adhesion of the filler material 70 to the surface of the sixth capping layer 346 or the wetting of the filler material 70 can be improved, and the filler material 70 can be properly adhered to a light converter 300. Therefore, the filler material 70 can properly fill recesses on the surface of the light converter 300 and can thus substantially planarize the surface of the light converter 300, thereby improving the durability of the display device 11. That is, the surface planarization function of the light converter 300 and the durability of the display device 11 can both be improved without considerably (e.g., significantly) increasing the thickness of the filler material 70 to fill recesses on the surface of the light converter 300.

Also, in the embodiment of FIGS. 19 through 21, the bonding force between the filler material 70 and the light provider 100_2 can be enhanced by providing the second outermost layer 181 on the thin-film encapsulation layer 170. The thin-film encapsulation layer 170 may include an encapsulation organic film 172. The encapsulation organic film 172, which is a planarization layer, may alleviate height differences or surface unevenness generated by the elements of the light provider 100_2, which are disposed below the encapsulation organic film 172. However, surface unevenness or height differences may be generated on a surface of the light provider 100_2 that faces the light converter 300. That is, the light provider 100_2 may include height differences or surface unevenness on at least part thereof. However, because the second outermost layer 181 is provided on the thin-film encapsulation layer 170, the height differences or the surface unevenness on the light provider 100_2 can be alleviated.

Figure 23:
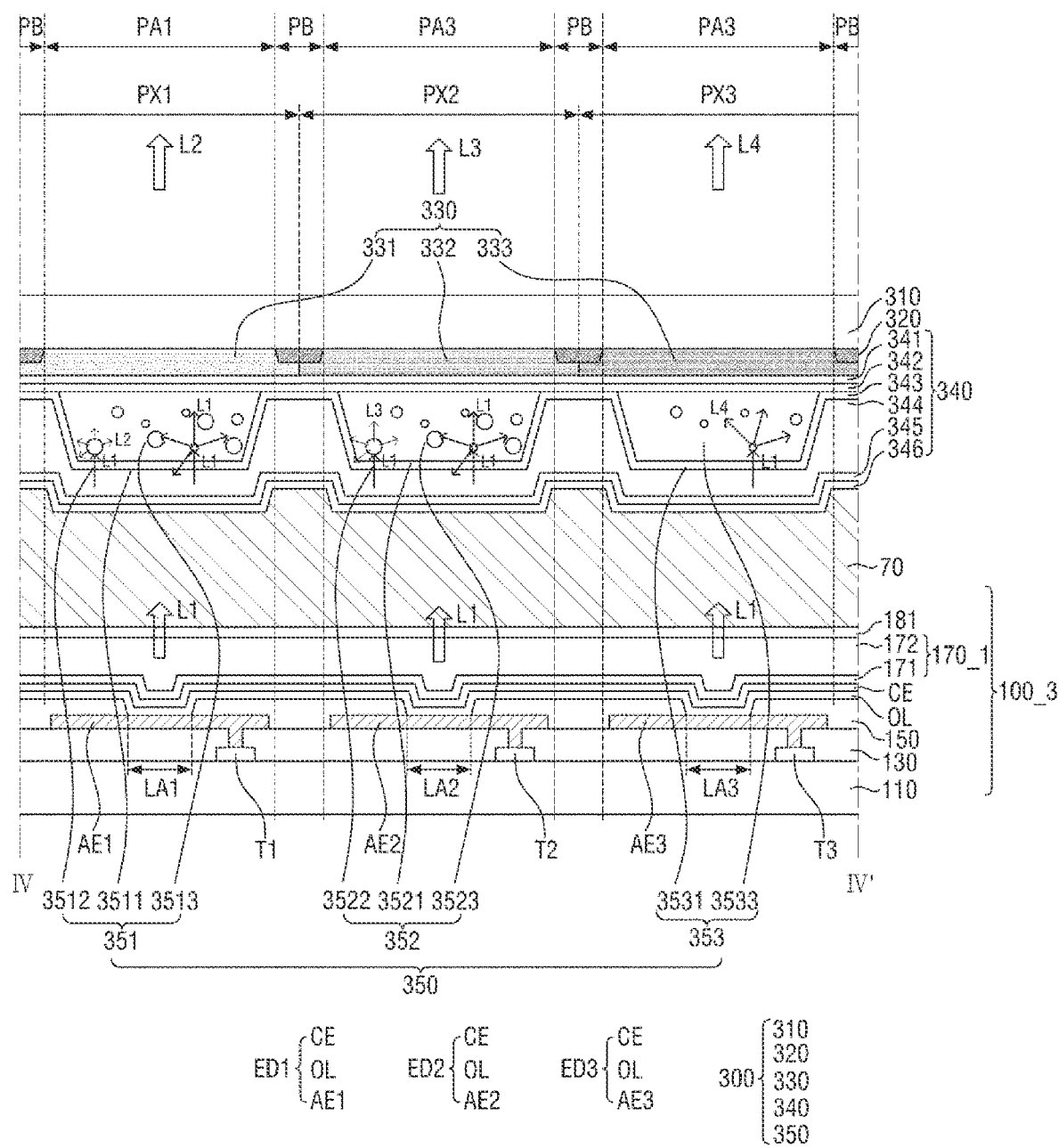

FIG. 23 is a cross-sectional view of a display device according to another embodiment of the present disclosure.

Referring to FIG. 23, a light provider 100_3 of a display device 13 differs from the light provider 100_2 of FIG. 19 in that a second encapsulation inorganic film 173 is not provided, and that a second outermost layer 181 is disposed directly on an encapsulation organic film 172.

As described above, the second outermost layer 181 may include nitrogen atoms. That is, when a second content Y of $AO_XN_Y$ that forms the second outermost layer 181 is at least greater than 0 and less than 1, the protective film function of the second outermost layer 181 can be improved, and as a result, the second outermost layer 181 can properly protect the light provider 100_3 without the aid of the second encapsulation inorganic film 173.

The second outermost layer 181 is illustrated as being a separate element from a thin-film encapsulation layer 170_1, but the present disclosure is not limited thereto. That is, the second outermost layer 181 may be understood as being included in the thin-film encapsulation layer 170_1. That is, the thin-film encapsulation layer 170_1 may include a first encapsulation inorganic film 171, the encapsulation organic film 172, and the second outermost layer 181.

In the embodiment of FIG. 23, as a first content X of a sixth capping layer 346 increases, the polarity of $AO_XN_Y$ that forms the sixth capping layer 346 may increase, and a first interfacial tension F1 may also increase. As a result, a first interfacial bonding force FSL1 between the sixth capping layer 346 and a filler material 70 may increase. Accordingly, the adhesion of the filler material 70 to the surface of the sixth capping layer 346 or the wetting of the filler material 70 can be improved, and the filler material 70 can be properly adhered to a light converter 300. Therefore, the filler material 70 can properly fill recesses on the surface of the light converter 300 and can thus substantially planarize the surface of the light converter 300. Once the surface of the light converter 300 is planarized, the risk of forming scratches can be reduced, and the durability of the display device 13 can be improved. That is, the surface planarization function of the light converter 300 and the durability of the display device 13 can both be improved without considerably (e.g., significantly) increasing the thickness of the filler material 70 to fill recesses on the surface of the light converter 300.

Figure 24:
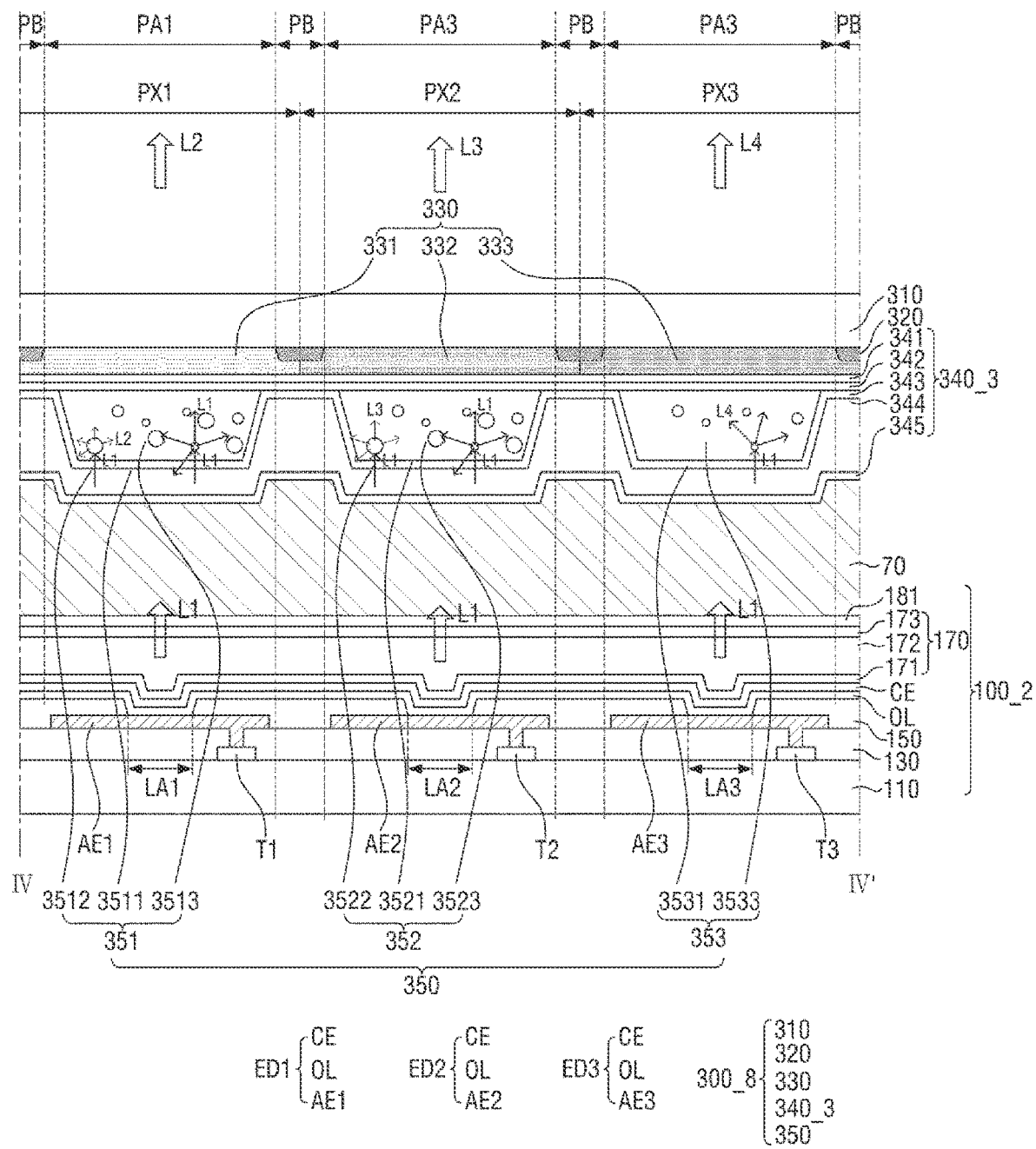

FIG. 24 is a cross-sectional view of a display device according to another embodiment of the present disclosure.

Referring to FIG. 24, a light converter 300_8 of a display device 14 differs from the light converter 300 of FIG. 19 in that it does not include a sixth capping layer 346, and that a second outermost layer 181 of a light converter 100_2 is disposed in contact with a filler material 70. The light converter 100_2 is the same as described above with reference to FIG. 19, and thus, a detailed description thereof will not be repeated.

A fifth capping layer 345 of the light converter 300_8 may be in partial contact with the filler material 70. The fifth capping layer 345 may be the outermost film (e.g., layer) of the light converter 300_8.

In the embodiment of FIG. 24, the bonding force between the filler material 70 and the light provider 100_2 can be enhanced by providing the second outermost layer 181 on a thin-film encapsulation layer 170. The thin-film encapsulation layer 170 may include an encapsulation organic film 172. The encapsulation organic film 172, which is a planarization layer, may alleviate height differences or surface unevenness generated by the elements of the light provider 100_2, which are disposed below the encapsulation organic film 172. However, surface unevenness or height differences may be generated on a surface of the light provider 100_2 that faces the light converter 300_8. That is, the light provider 100_2 may include height differences or surface unevenness on at least part thereof. However, because the second outermost layer 181 is provided on the thin-film encapsulation layer 170, the height differences or the surface unevenness on the light provider 100_2 can be alleviated.

A method of manufacturing a display device according to an embodiment of the present disclosure will hereinafter be described.

Figure 25:
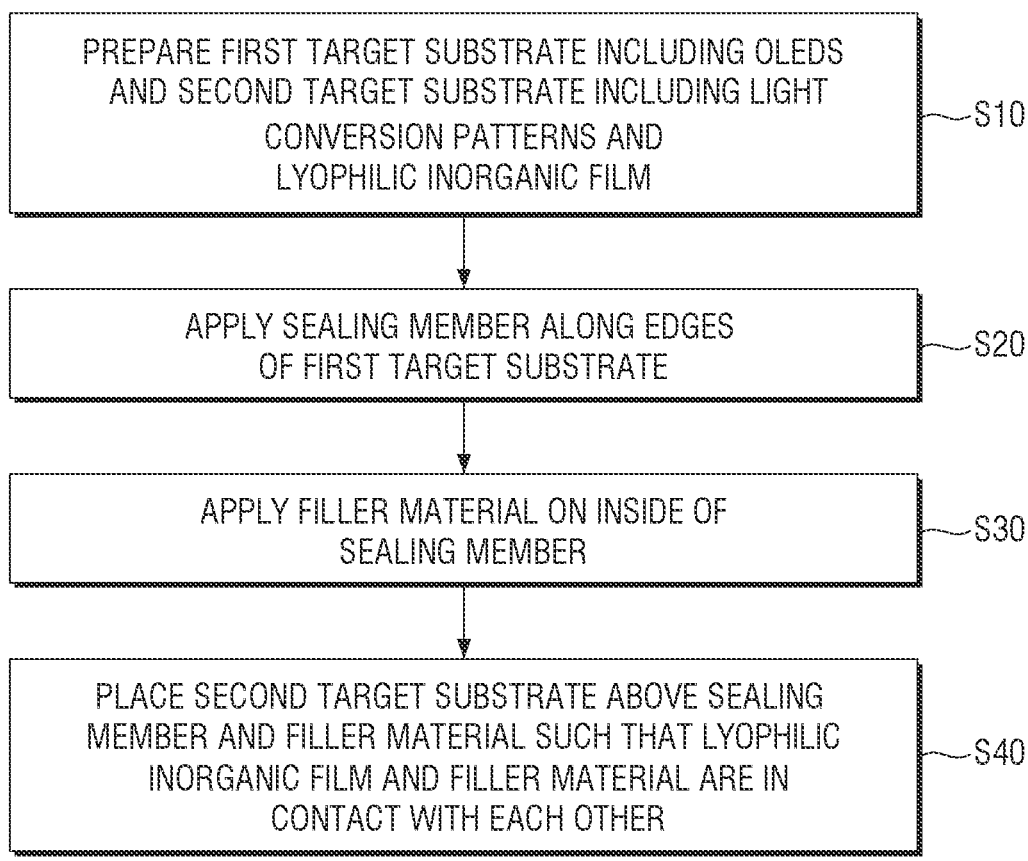
FIG. 25 is a flowchart illustrating a method of manufacturing a display device according to an embodiment of the present disclosure.
Figure 26:
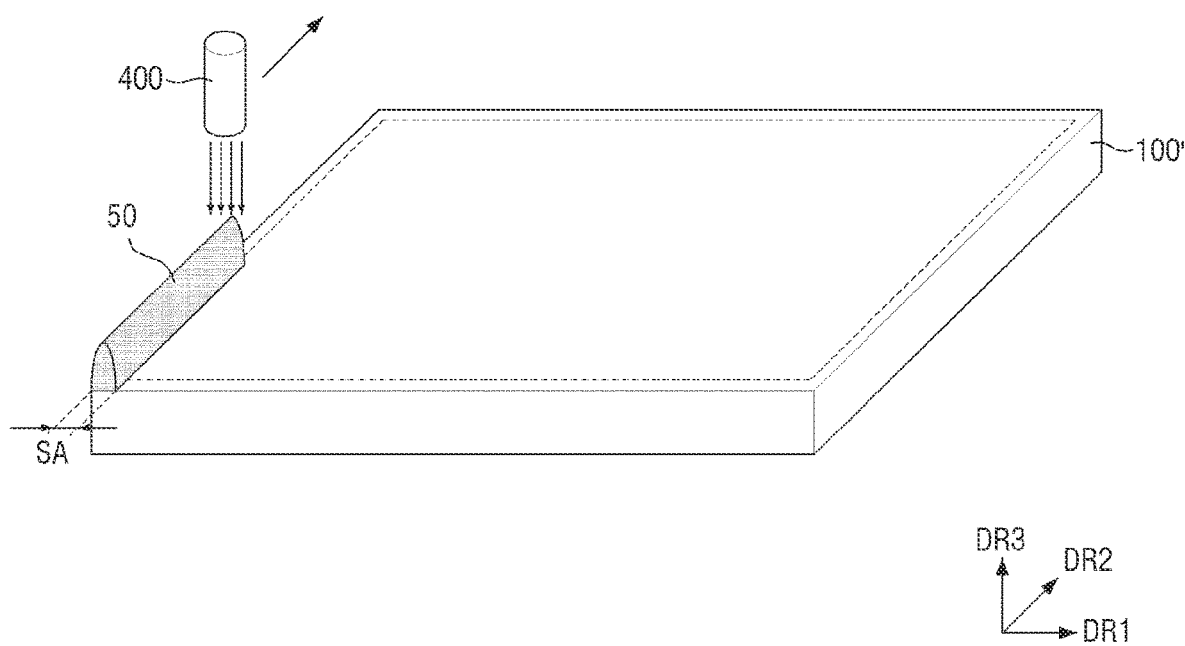
FIG. 26 is a perspective view illustrating the formation of a sealing member according to the embodiment of FIG. 25.
Figure 27:
FIG. 27 is a plan view illustrating a first target substrate obtained from the formation of a sealing member according to the embodiment of FIG. 25.
Figure 28A:
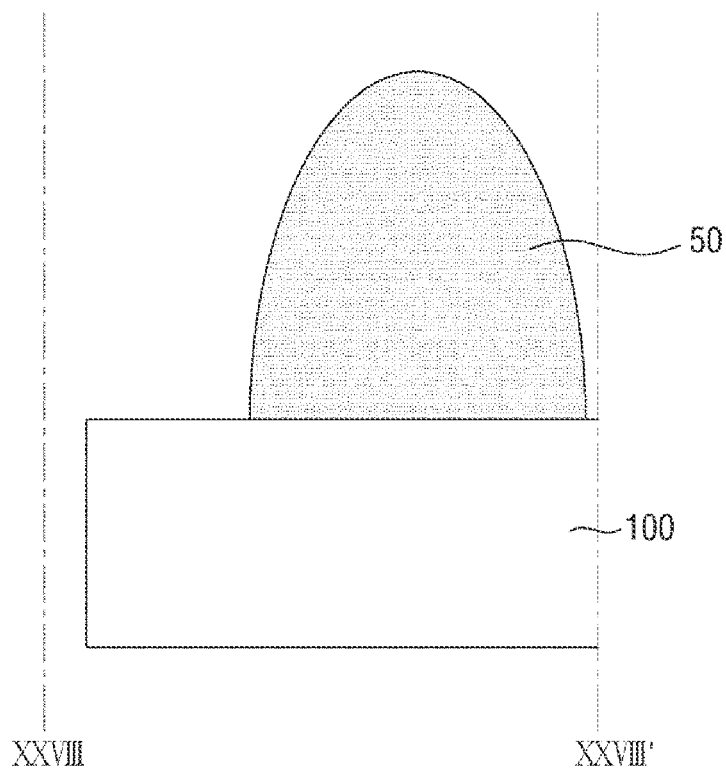
FIGS. 28A and 28B are cross-sectional views taken along the line XXVIII-XXVIII' of FIG. 27.
Figure 28B:
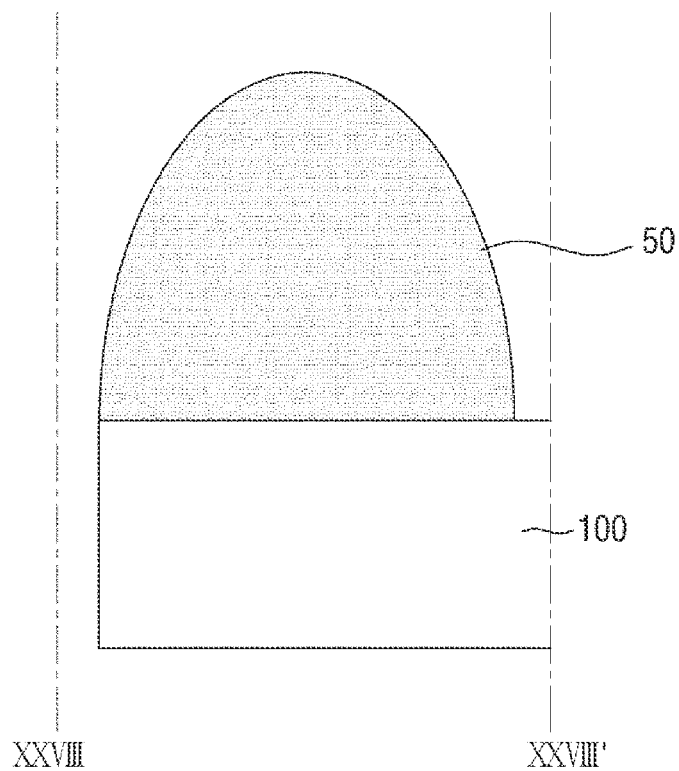
Figure 29:
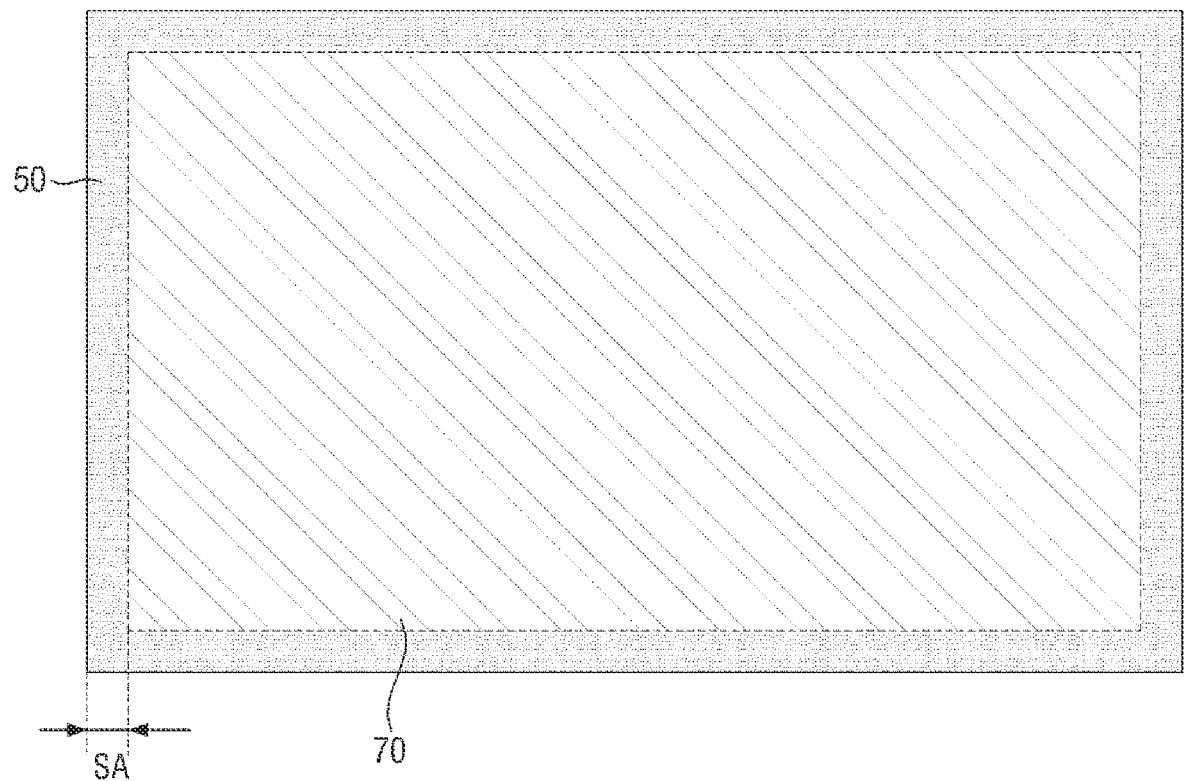
FIG. 29 is a plan view illustrating a target substrate obtained from the formation of a filler material according to the embodiment of FIG. 25.

FIG. 25 is a flowchart illustrating a method of manufacturing a display device according to an embodiment of the present disclosure, FIG. 26 is a perspective view illustrating the formation of a sealing member according to the embodiment of FIG. 25, FIG. 27 is a plan view illustrating a first target substrate obtained from the formation of the sealing member according to the embodiment of FIG. 25, FIGS. 28A through 29B are cross-sectional views taken along the line XXVIII-XXVIII' of FIG. 27, and FIG. 29 is a plan view illustrating a target substrate obtained from the formation of a filler material according to the embodiment of FIG. 25. Referring to FIGS. 25 and 26, a first target substrate 100' including OLEDs "ED" and a second target substrate 300' including light conversion patterns 350 and a lyophilic inorganic film (i.e., a sixth capping layer, hereinafter used interchangeably) 346, which is disposed on the light conversion patterns 350 to cover the light conversion patterns 350, are prepared (S10). Here, the first target substrate 100' corresponds to the light provider 100 of FIG. 4, and the second target substrate 300' corresponds to the light converter 300 of FIG. 4. The light conversion patterns 350 and the lyophilic inorganic layer 346 are as already described above with reference to FIG. 4. The preparation of the second target substrate 300' may include forming the lyophilic inorganic film 346 on the light conversion patterns 350.

Thereafter, a sealing member 50 is applied along the edges of the first target substrate 100' (S20). For example, a sealing device 400, which is for applying the sealing member 50, is placed above the first target substrate 100'. Then, the sealing member 50 is applied on the surface of the first target substrate 100' by moving the sealing device 400 in one direction. The sealing device 400 may be a device for applying the sealing member 50 or for injecting or transferring the sealing member 50.

As illustrated in FIG. 26, the sealing member 50 may be applied along the edges of the first target substrate 100' by utilizing the sealing device 400.

The sealing member 50 may not readily collapse, but may maintain its shape, even after the application of a filler material 70, and can thus prevent or substantially prevent the filler material 70 from overflowing out of a display device 1.

If the sealing member 50 does not readily collapse, but maintains its shape, the sealing member 50 can be prevented or substantially prevented from flowing out of the first target substrate 100'. In this case, the sealing member 50 may have a sufficient (e.g., suitable) viscosity to maintain its shape to some extent without readily collapsing.

However, the present disclosure is not limited to this. Alternatively, the sealing member 50 may readily collapse after applied or may collapse over time. Thus, a curing process may be further performed during or after the application of the sealing member 50.

Thereafter, the filler material 70 is applied on the first target substrate 100' on the inside (in a plan view) of the sealing member 50 (S30).

As mentioned above, the sealing member 50 may collapse over time and may flow out of a sealing area SA. In this case, if the filler material 70 is already applied, the filler material 70 may also spill over the sealing member 50.

In order to prevent or substantially prevent the sealing member 50 from flowing out of the sealing area SA, the sealing member 50 may be formed on the inside of at least one side of the first target substrate 100', as illustrated in FIG. 28A.

The sealing member 50 may be formed to the same height as, or a greater height than, the filler material 70 to prevent or substantially prevent the filler material 70 from overflowing.

After the formation of the sealing member 50, a release film may further be disposed on the sealing member 50 to overlap with the sealing member 50. The release film can prevent or substantially prevent the sealing member 50 from being damaged by external foreign materials and/or the like until the second target substrate 300' is attached. Some of the filler material 70 may remain on the release film. The height of the filler material 70 may be the same as, or less than, the height of the sealing member 50, and some of the filler material 70 may remain on the sealing member 50 and/or on the top surface of the release film. The release film may be peeled off before the second target substrate 300' is attached after the application of the filler material 70. Some of the filler material 70 that remains on the top surface of the release film may be removed along with the release film when the release film is peeled off. In one embodiment, the release film may not be provided.

The second target substrate 300' is placed above the sealing member 50 and the filler material 70 such that the lyophilic inorganic film 346 may be in contact with the filler material 70 (S40).

A method of manufacturing a display device according to another embodiment of the present disclosure will hereinafter be described.

Figure 30:
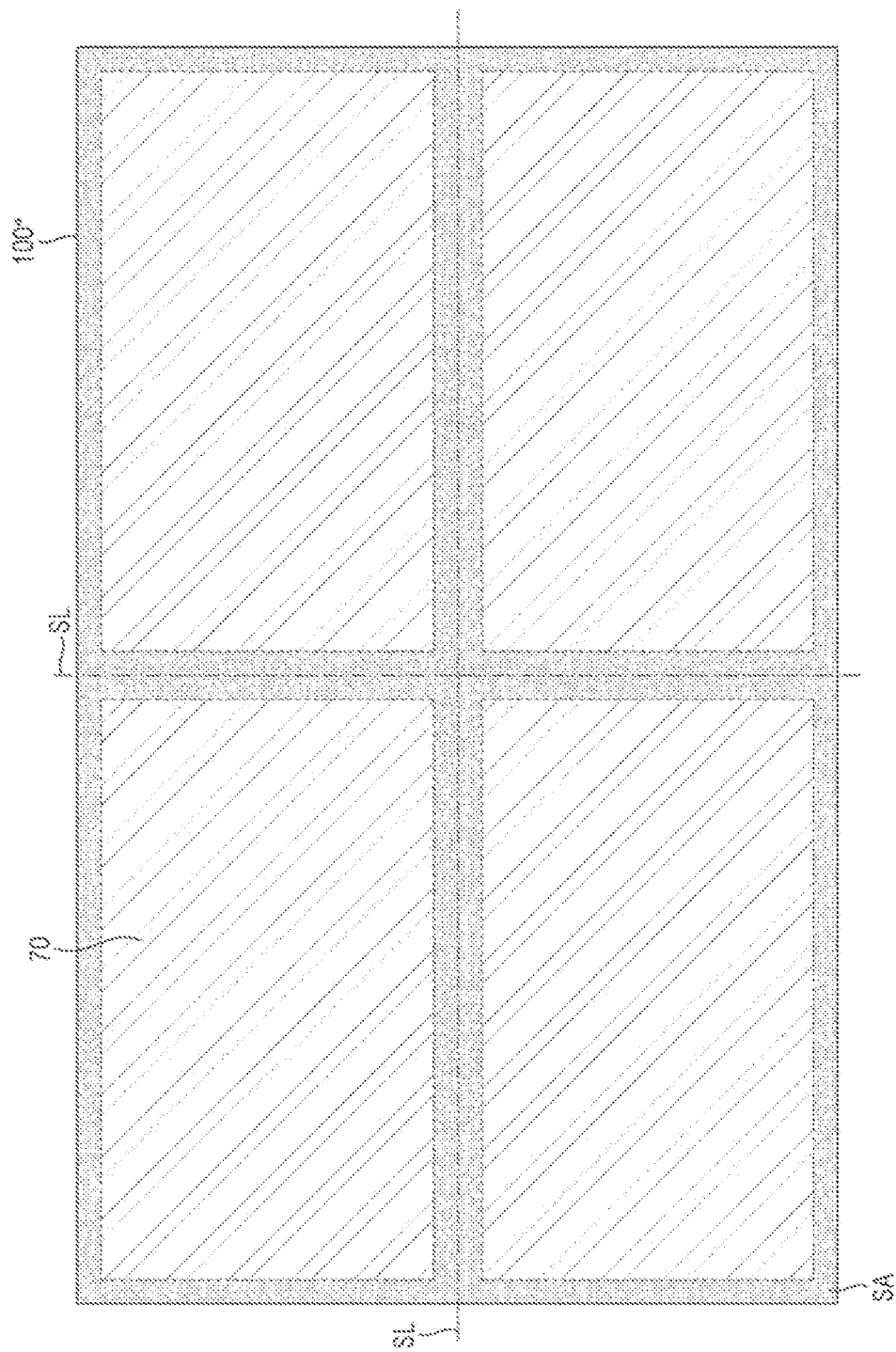
FIG. 30 is a plan view for explaining a method of manufacturing a display device according to another embodiment of the present disclosure.
Figure 31:
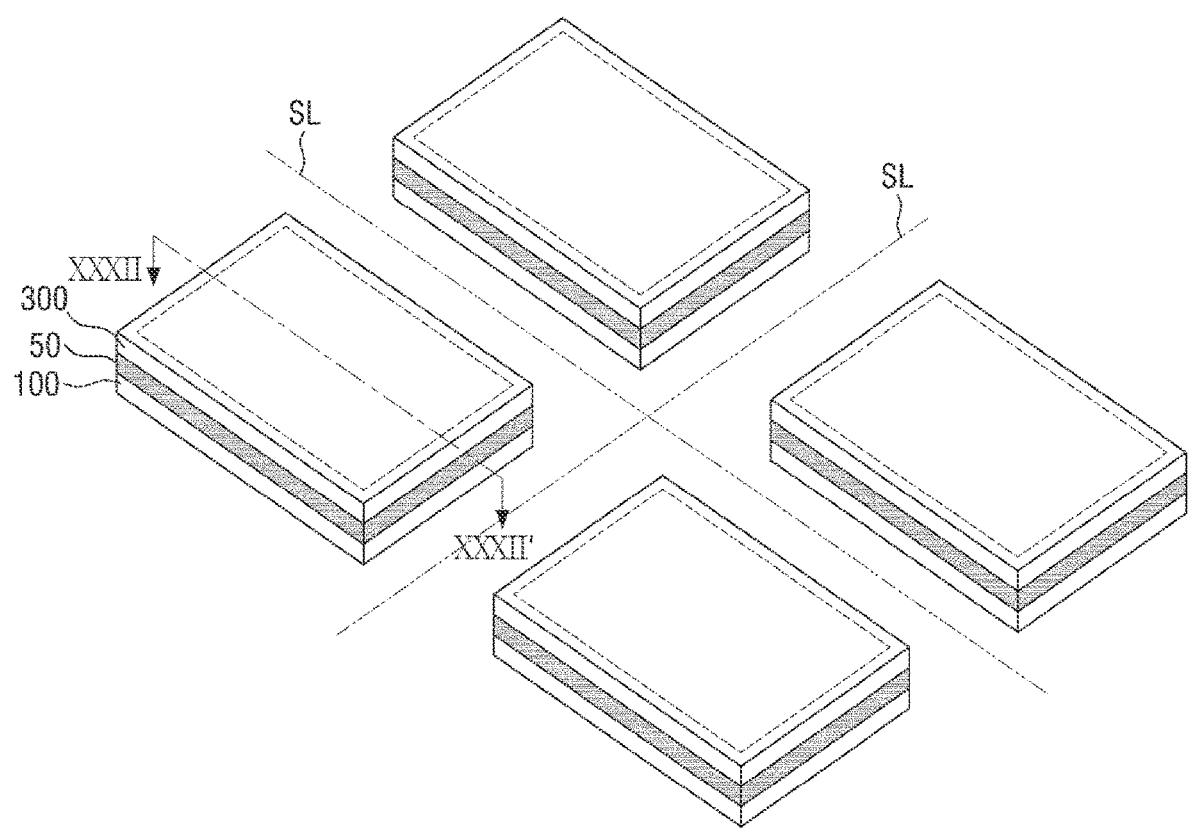
FIG. 31 is a perspective view illustrating how to obtain first substrates and second substrates from first and second mother substrates according to the embodiment of FIG. 30.
Figure 32A:
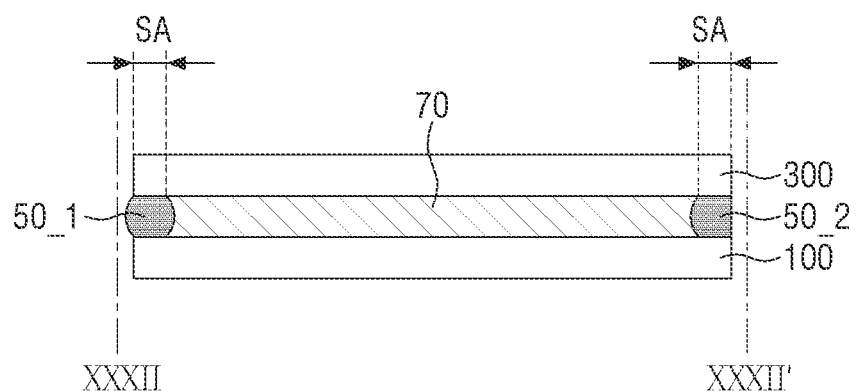
FIGS. 32A and 32B are cross-sectional views taken along the line XXXII-XXXII' of FIG. 31.
Figure 32B:
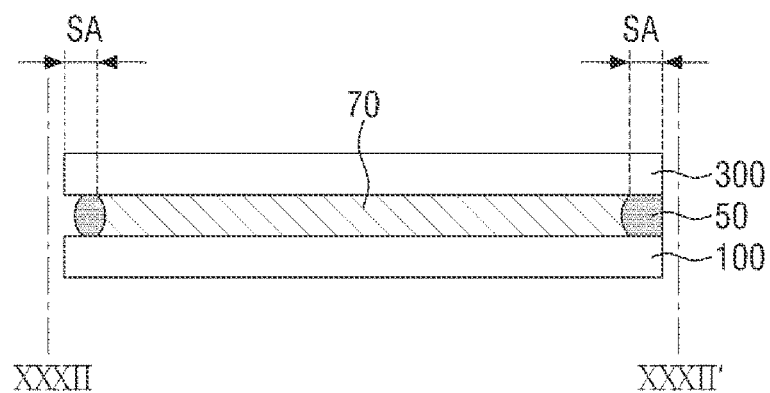

FIG. 30 is a plan view for explaining a method of manufacturing a display device according to another embodiment of the present disclosure. FIG. 31 is a perspective view illustrating how to obtain first substrates and second substrates from first and second mother substrates according to the embodiment of FIG. 30, and FIGS. 32A and 32B are cross-sectional views taken along the line XXXII-XXXII' of FIG. 31. FIGS. 30 through 32B illustrate processes of forming first and second mother substrates on a sheet basis, forming first substrates from the first mother substrate, and forming second substrates from the second mother substrate. The embodiment of FIGS. 30 through 32B differs from the embodiment of FIGS. 25 through 29 in that the manufacture of a display device is performed on a sheet basis utilizing first and second mother substrates. The embodiment of FIGS. 30 through 32B will hereinafter be described, focusing mainly on the difference with the embodiment of FIGS. 25 through 29.

Referring to FIGS. 30 through 32B, first and second mother substrates 100" and 300", which are coupled together via a sealing member 50, form a target panel.

As illustrated in FIG. 30, a sealing area SA may be further disposed between adjacent parts of a filler material 70. That is, the sealing member 50 may be disposed between adjacent parts of the filler material 70 and may be divided between display panels in the process of separating the target panel into the display panels.

The separation of the target panel into the individual display panels may include performing a scribing process along boundaries SL between the individual display panels. The scribing process may be performed utilizing a heating knife or a laser. The boundaries SL may be included in the sealing area SA, in which case, parts of the sealing member 50 disposed between adjacent individual display panels may be separated from each other and may thus be included in different individual display panels. FIGS. 30 and 31 illustrate an example in which the target panel is divided into four display panels, but the present disclosure is not limited thereto. Alternatively, the target panel may be divided into two, three, or five display panels.

Referring to FIGS. 32A and 32B, the sealing member 50 includes a first sealing member 50-1 disposed on the left and a second sealing member 50-2 disposed on the right. The second sealing member 50-2 may be a part of the sealing member 50 separated from the rest of the sealing member 50 by a scribing process performed on the target panel. That is, the second sealing member 50-2 may be a part of the sealing member 50 disposed on a sheet (i.e., the target panel) to overlap with one of the boundaries SL. The first sealing member 50-1, unlike the second sealing member 50-2, may be a part of the sealing member 50 disposed on an outer side of the target panel to not overlap with the boundaries SL.

The first sealing member 50-1 may include an outwardly convex shape on the outside thereof and an inwardly convex shape on the inside thereof, but the present disclosure is not limited thereto. Alternatively, the first sealing member 50-1 may have a rectilinear profile on the outside and/or the inside thereof in a cross-sectional view.

The second sealing member 50-2 may be a part of the sealing member 50 divided into an individual display panel along the boundaries SL in the process of performing a scribing process on the target panel. Thus, in a cross-sectional view, the second sealing member 50-2 may have a rectilinear profile on the outside thereof near an adjacent individual display panel and may thus be aligned with a light provider 100 and a light converter 300 in a thickness direction. Because the light provider 100 and the light converter 300 correspond to the first target substrate 100' and the second target substrate 300', respectively, the second sealing member 50-2 may be understood as being aligned with the first and second target substrates 100' and 300' in the thickness direction. The second sealing member 50-2, like (e.g., similar to) the first sealing member 50-1, may include an inwardly convex shape on the inside thereof, but the present disclosure is not limited thereto. Alternatively, the second sealing member 50-2 may have a rectilinear profile on the inside thereof in a cross-sectional view.

In the embodiment of FIGS. 30 through 32B, individual display panels can be fabricated on a sheet basis, and as a result, efficiency can be improved as compared to the embodiment of FIGS. 25 through 29.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Although the preferred embodiments of the present invention have been disclosed for illustrative purposes, those skilled in the art will appreciate that various suitable modifications, additions and substitutions are possible, without departing from the scope and spirit of the invention as disclosed in the accompanying claims, and equivalents thereof.

What is claimed is:

1. A display device comprising:
a first substrate;
a plurality of light-emitting elements on the first substrate;
an encapsulation layer covering the plurality of light-emitting elements;
a second substrate facing the first substrate;
a plurality of color filters on the second substrate;
a capping layer comprising an inorganic material on the plurality of color filters;
a plurality of light conversion patterns on the capping layer;
a first outermost layer located between the capping layer and the encapsulation layer, and comprising $SiO_xN_y$, in which $x>y>0$; and
a filler material between the encapsulation layer and the first outermost layer,
wherein the filler material comprises a silicon-based organic material or an acrylic organic material,
wherein the plurality of color filters are between the second substrate and the capping layer, and
wherein the plurality of light conversion patterns are between the capping layer and the first outermost layer.

2. The display device of claim 1, wherein a first interfacial tension of the first outermost layer is greater than a second interfacial tension of the filler material.

3. The display device of claim 2, wherein the first interfacial tension of the first outermost layer is 60 mN/m or greater.

4. The display device of claim 3, wherein a polar component of the first interfacial tension is 35 mN/m or greater.

5. The display device of claim 1, wherein a difference in refractive index between the first outermost layer and the filler material is less than or equal to about 0.2.

6. The display device of claim 1, wherein the first outermost layer has a thickness of about 200 Å to about 1000 Å and a transmittance of about 80% or higher.

7. The display device of claim 1, further comprising:
a sealant between the first and second substrates and surrounding the filler material in a plan view,
wherein the filler material is in a space surrounded by the encapsulation layer, the first outermost layer, and the sealant.

8. The display device of claim 7, wherein the sealant is in contact with the filler material and is in direct contact with surfaces of the first and second substrates to couple the surfaces of the first and second substrates together.

9. The display device of claim 1, wherein each of the plurality of light-emitting elements comprises an anode electrode, a cathode electrode facing the anode electrode, and an organic layer between the anode and cathode electrodes, the organic layer being configured to emit blue light.

10. The display device of claim 1, wherein
the plurality of light-emitting elements is configured to emit blue light, and
the plurality of light conversion patterns comprises a first wavelength conversion pattern configured to convert the blue light to red light, a second wavelength conversion pattern configured to convert the blue light to green light, and a light-transmitting pattern configured to transmit the blue light therethrough.

11. The display device of claim 10, wherein
the first outermost layer forms convex parts in regions where the plurality of light conversion patterns is located and concave parts in regions where the plurality of light conversion patterns is not located.

12. The display device of claim 11, wherein the filler material fills the concave parts of the first outermost layer.

13. The display device of claim 11, further comprising:
a light shield overlapping the concave parts of the first outermost layer in a thickness direction.

14. The display device of claim 1, wherein the capping layer has surface unevenness and having a concave portion and a convex portion, and
wherein the first outermost layer has a concave portion and a convex portion overlapping with the concave portion and the convex portion of the capping layer, respectively.

15. A display device comprising:
a first substrate;
a plurality of light-emitting elements on the first substrate;
an encapsulation layer covering the plurality of light-emitting elements;
a second substrate facing the first substrate;

a capping layer comprising an inorganic material on the second substrate;
a first outermost layer located between the capping layer and the encapsulation layer, and comprising $SiO_XN_Y$,
a plurality of light conversion patterns between the second substrate and the first outermost layer,
a filler material between the encapsulation layer and the first outermost layer, and
a light shield,
wherein the plurality of light-emitting elements is configured to emit blue light, and the plurality of light conversion patterns comprises a first wavelength conversion pattern configured to convert the blue light to red light, a second wavelength conversion pattern configured to convert the blue light to green light, and a light-transmitting pattern configured to transmit the blue light therethrough,
wherein the first outermost layer forms convex parts in regions where the plurality of light conversion patterns is located and concave parts in regions where the plurality of light conversion patterns is not located, and the light shield overlaps the concave parts of the first outermost layer in a thickness direction,
wherein the filler material comprises a silicon-based organic material or an acrylic organic material,
wherein the light shield is between the capping layer and the first outermost layer, and
wherein the light shield contacts the capping layer and the first outermost layer.

16. A display device comprising:
a first substrate;
a plurality of light-emitting elements on the first substrate;
an encapsulation layer covering the plurality of light-emitting elements;
a second substrate facing the first substrate;
a capping layer comprising an inorganic material on the second substrate;
a first outermost layer located between the capping layer and the encapsulation layer, and comprising $SiO_XN_Y$,
a plurality of light conversion patterns between the second substrate and the first outermost layer,
a filler material between the encapsulation layer and the first outermost layer, and
a light shield,
wherein the plurality of light-emitting elements is configured to emit blue light, and the plurality of light conversion patterns comprises a first wavelength conversion pattern configured to convert the blue light to red light, a second wavelength conversion pattern configured to convert the blue light to green light, and a light-transmitting pattern configured to transmit the blue light therethrough,
wherein the first outermost layer forms convex parts in regions where the plurality of light conversion patterns is located and concave parts in regions where the plurality of light conversion patterns is not located, and the light shield overlaps the concave parts of the first outermost layer in a thickness direction,
wherein the filler material comprises a silicon-based organic material or an acrylic organic material, and
wherein the light shield is between the encapsulation layer and the filler material.

\* \* \* \* \*